(12) United States Patent
Kim et al.

(10) Patent No.: US 12,207,469 B2
(45) Date of Patent: Jan. 21, 2025

(54) VERTICAL MEMORY DEVICES AND METHODS OF MANUFACTURING THE SAME

(71) Applicant: SAMSUNG ELECTRONICS CO., LTD., Suwon-si (KR)

(72) Inventors: Junhyoung Kim, Seoul (KR); Seonho Yoon, Hwaseong-si (KR); Bonghyun Choi, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/386,112

(22) Filed: Nov. 1, 2023

(65) Prior Publication Data

US 2024/0064981 A1 Feb. 22, 2024

Related U.S. Application Data

(60) Division of application No. 17/567,364, filed on Jan. 3, 2022, now Pat. No. 11,818,889, which is a (Continued)

(30) Foreign Application Priority Data

Aug. 7, 2019 (KR) .................. 10-2019-0095919

(51) Int. Cl.
*H10B 43/27* (2023.01)
*H01L 23/522* (2006.01)
*H10B 41/27* (2023.01)

(52) U.S. Cl.
CPC ......... *H10B 43/27* (2023.02); *H01L 23/5226* (2013.01); *H10B 41/27* (2023.02)

(58) Field of Classification Search
None
See application file for complete search history.

(56) References Cited

U.S. PATENT DOCUMENTS 8,592,912 B2 11/2013 Hwang et al.
9,165,774 B2 10/2015 Oh et al.
(Continued)

FOREIGN PATENT DOCUMENTS

CN         107527914 A   12/2017
KR    10-2010-0053795 A   5/2010
(Continued)

OTHER PUBLICATIONS

Office Action dated Dec. 11, 2023 from the Korean Intellectual Property Office (KIPO) for Korean Patent Application No. 10-2019-0095919.

(Continued)

*Primary Examiner* — Hsien Ming Lee
(74) *Attorney, Agent, or Firm* — Muir Patent Law, PLLC

(57) ABSTRACT

A vertical memory device includes a substrate with a cell region, a through via region on opposite sides of the cell region, and a mold region surrounding the cell and through via regions, gate electrodes spaced apart from each other along a first direction vertical to an upper surface of the substrate, and extending in a second direction parallel to the upper surface of the substrate, a channel extending in the first direction on the cell region, and extending through at least a portion of the stacked gate electrodes, and a first mold including first and second layers alternately and repeatedly stacked along the first direction on the mold region, the first and second layers including different insulation materials from each other, and each of the second layers of the first mold being at the same height as and contact a corresponding one of the gate electrodes.

17 Claims, 36 Drawing Sheets

Related U.S. Application Data continuation of application No. 16/850,097, filed on Apr. 16, 2020, now Pat. No. 11,217,603.

(56) References Cited

U.S. PATENT DOCUMENTS

| | | |
|---|---|---|
| 9,812,464 B1 | 11/2017 | Hwang |
| 9,922,991 B2 | 3/2018 | Kamigaki et al. |
| 11,217,603 B2 | 1/2022 | Kim et al. |
| 2012/0187471 A1 | 7/2012 | Yu et al. |
| 2015/0214242 A1 | 7/2015 | Lee |
| 2015/0263029 A1 | 9/2015 | Kim et al. |
| 2016/0163635 A1 | 6/2016 | Yun et al. |
| 2016/0163732 A1 | 6/2016 | Lim et al. |
| 2016/0268287 A1 | 9/2016 | Park et al. |
| 2017/0018564 A1 | 1/2017 | Nihei et al. |
| 2019/0035808 A1 | 1/2019 | Hwang et al. |
| 2019/0214404 A1 | 7/2019 | Ahn et al. |
| 2020/0295042 A1 | 9/2020 | Lim et al. |

FOREIGN PATENT DOCUMENTS

| | | |
|---|---|---|
| KR | 10-2016-0069903 A | 6/2016 |
| WO | 2017122302 A1 | 7/2017 |
| WO | 2018051872 A1 | 3/2018 |

OTHER PUBLICATIONS

Office Action dated Jan. 31, 2022 from the German Patent Office for German Patent Application No. 10 2020 110 521.5 corresponding to the above-identified application.

Office Action dated Aug. 6, 2024 from the Japanese Patent Office for corresponding Japanese Patent Application No. 2020-105946.

Office Action dated Aug. 9, 2024 from the Chinese Patent Office for corresponding Chinese Patent Application No. 202010512608.8.

FIG. 1
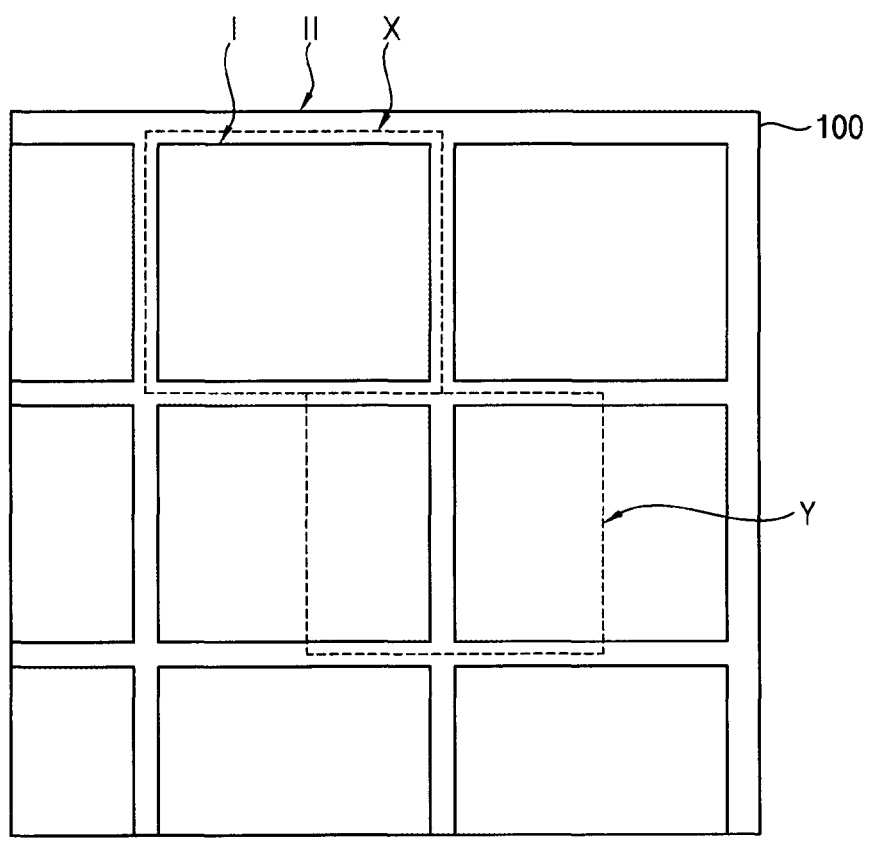
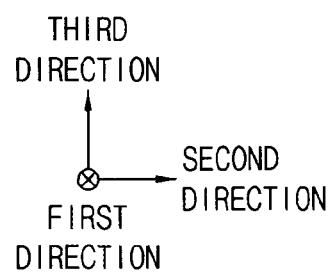

VERTICAL MEMORY DEVICES AND METHODS OF MANUFACTURING THE SAME

CROSS-REFERENCE TO RELATED APPLICATION

This is a division of U.S. patent application Ser. No. 17/567,364 filed Jan. 3, 2022, which is a continuation of U.S. patent application Ser. No. 16/850,097 filed Apr. 16, 2020, now U.S. Pat. No. 11,217,603, issued on Jan. 4, 2022, each which is incorporated by reference herein in its entirety.

Korean Patent Application No. 10-2019-0095919, filed on Aug. 7, 2019, in the Korean Intellectual Property Office, and entitled: "Vertical Memory Devices and Methods of Manufacturing the Same," is incorporated by reference herein in its entirety.

BACKGROUND

1. Field

Embodiments relate to vertical memory devices and methods of manufacturing the same.

2. Description of the Related Art

In a method of manufacturing a VNAND flash memory device, insulation layers and sacrificial layers may be alternately and repeatedly stacked on a substrate including a chip region and a scribe lane (S/L) region to form a mold layer, and an etching process may be performed to pattern the mold layer into a staircase shape. As the etching process is performed, a portion of the mold layer formed on the S/L region may be removed, and an insulating interlayer may be formed to fill the removed portion of the mold layer. The number of levels of the mold layer may be increased, and the thickness of the insulating interlayer also may be increased corresponding thereto.

SUMMARY

According to example embodiments, there is provided a vertical memory device. The vertical memory device may include a substrate including a cell region, a through via region formed on each of both sides of the cell region, and a mold region surrounding the cell region and the through via region, a gate electrode structure including gate electrodes, the gate electrodes being stacked to be spaced apart from each other along a first direction substantially vertical to an upper surface of the substrate, each of the gate electrodes extending in a second direction substantially parallel to the upper surface of the substrate, a channel extending in the first direction on the cell region of the substrate, and extending through at least a portion of the gate electrode structure, and a first mold including first and second layers alternately and repeatedly stacked along the first direction on the mold region of the substrate, the first and second layers including different insulation materials from each other. Each of the first layers of the first mold may be formed at the same height as, and may contact each of the gate electrodes of the gate electrode structure.

According to example embodiments, there is provided a vertical memory device. The vertical memory device may include gate electrode structures including gate electrodes stacked to be spaced apart from each other on a substrate along a first direction substantially vertical to an upper surface of the substrate, each of the gate electrodes extending in a second direction substantially parallel to the upper surface of the substrate, the gate electrode structures spaced apart from each other in a third direction substantially parallel to the upper surface of the substrate and intersecting the second direction, a channel extending in the first direction on the substrate, and extending through at least a portion of the gate electrode structure, and a first mold including first and second layers alternately and repeatedly stacked along the first direction on the substrate, and contacting at least one of the gate electrode structures formed on both ends in the third direction. Each of the gate electrode structures may have a staircase shape with each gate electrode as each stair-step layer, and a portion of the first mold opposite to the gate electrode structures may have a staircase shape with one first layer and one second layer sequentially stacked together as each stair-step layer. The first layer included in each of the stair-step layer of the first mold and each of the stair-step layers of the gate electrode structures corresponding thereto may be formed at the same height as each other.

According to example embodiments, there is provided a vertical memory device. The vertical memory device may include a circuit pattern on a substrate, a base pattern on the circuit pattern, gate electrode structures including gate electrodes stacked to be spaced apart from each other on the base pattern along a first direction substantially vertical to an upper surface of the substrate, each of the gate electrodes extending in a second direction substantially parallel to the upper surface of the substrate, the gate electrode structures spaced apart from each other in a third direction substantially parallel to the upper surface of the substrate and intersecting the second direction, channels extending in the first direction on the base pattern, and extending through at least a portion of the gate electrode structure, a charge storage structure on an outer sidewall of each of the channels, common source patterns (CSPs) formed between the gate electrode structures neighboring each other in the third direction, each of the CSPs extending in the second direction, a first mold including first and second layers alternately and repeatedly stacked along the first direction on the base pattern, and contacting a sidewall of at least one of the gate electrode structures formed on both ends in the third direction, a second mold formed between neighboring gate electrode structures being formed on a central portion in the third direction among the gate electrode structures, extending in the second direction, and including first and second patterns alternately and repeatedly stacked along the first direction, the first and second patterns including substantially the same materials as the first and second layers, respectively, and a through via extending in the first direction between the gate electrode structures and the first mold, and electrically connected to the circuit pattern.

According to example embodiments, there is provided a method of manufacturing a vertical memory device. The method may include alternately and repeatedly stacking an insulation layer and a sacrificial layer along a first direction to form a mold layer on a substrate including a cell region, a through via region formed on each of both sides of the cell region, and a mold region surrounding the cell region and the through via region, and a scribe lane (S/L) region surrounding the mold region, the first direction substantially vertical to an upper surface of the substrate, removing a portion of the mold layer formed on the through via region, and portions of the cell region and the mold region adjacent thereto to form a first mold and a second mold, the first mold and the second mold formed on the mold region and the S/L region, and a second mold on the cell region, respectively, forming a channel extending through the second mold, forming an opening extending through the second mold, and replacing each of the sacrificial layers included in the second mold with gate electrodes through the opening.

According to example embodiments, there is provided a method of manufacturing a vertical memory device. The method may include alternately and repeatedly stacking an insulation layer and a sacrificial layer along a first direction to form a mold layer on a substrate along a first direction substantially vertical to an upper surface of the substrate, forming a first opening that extends through the mold layer to partially remove the mold layer, a portion of the mold layer surrounding the first opening having a staircase shape, forming a channel to extend through the mold layer, forming a second opening to extend through the mold layer, and replacing the sacrificial layers included in the mold layer with gate electrodes, respectively, through the second opening. When replacing the sacrificial layers with the gate electrodes, the sacrificial layers included in an edge portion of the mold may not be replaced.

According to example embodiments, there is provided a method of manufacturing a vertical memory device. The method may include alternately and repeatedly stacking an insulation layer and a sacrificial layer along a first direction to form a mold layer on a substrate along a first direction substantially vertical to an upper surface of the substrate, partially removing the mold layer to form a plurality of first openings along a second direction substantially parallel to the upper surface of the substrate, each of the first openings extending through the mold layer and extending in a third direction substantially parallel to the upper surface of the substrate and intersecting the second direction, a portion of the mold layer surrounding each of the first openings having a staircase shape, forming a channel to extend through the portion of the mold layer between the first openings and extend in the first direction, forming a plurality of second openings to extend through the portion of the mold layer and extend in the second direction, and forming a plurality of molds to be spaced apart from each other along the third direction, and replacing the sacrificial layers included in the plurality of molds layer with gate electrodes, respectively, through the second openings.

BRIEF DESCRIPTION OF THE DRAWINGS

Features will become apparent to those of skill in the art by describing in detail exemplary embodiments with reference to the attached drawings, in which:

FIGS. 1 to 5 illustrate plan views and perspective views of a vertical memory device in accordance with example embodiments.

DETAILED DESCRIPTION

Vertical memory devices and methods of manufacturing the same in accordance with example embodiments will be described more fully hereinafter with reference to the accompanying drawings.

Hereinafter, a vertical direction substantially perpendicular to an upper surface of a substrate is defined as a first direction, and two directions intersecting with each other among horizontal directions substantially parallel to the upper surface of the substrate are defined as second and third directions, respectively. In example embodiments, the second and third directions may be orthogonal to each other.

Figure 2:
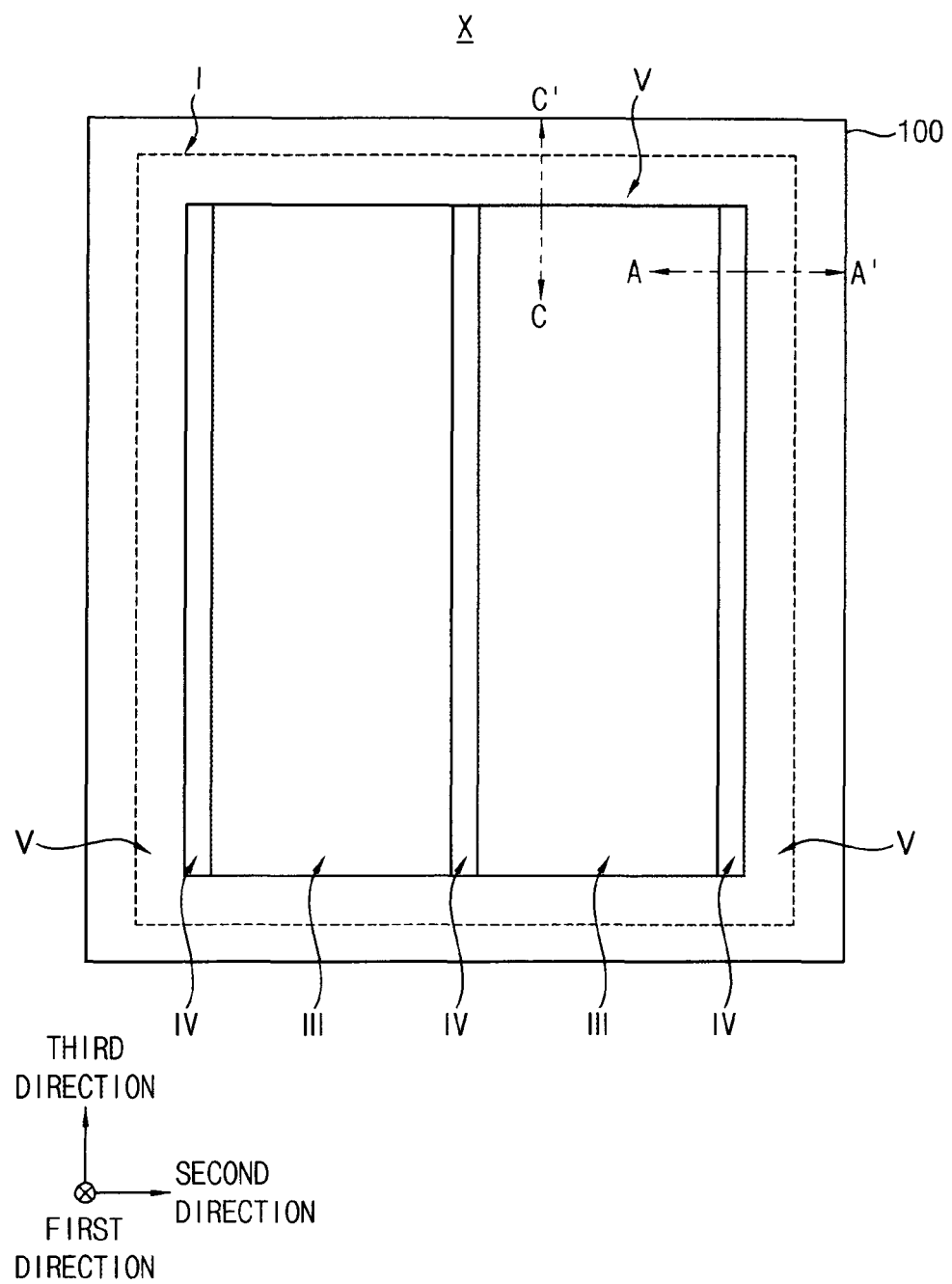
Figure 3:
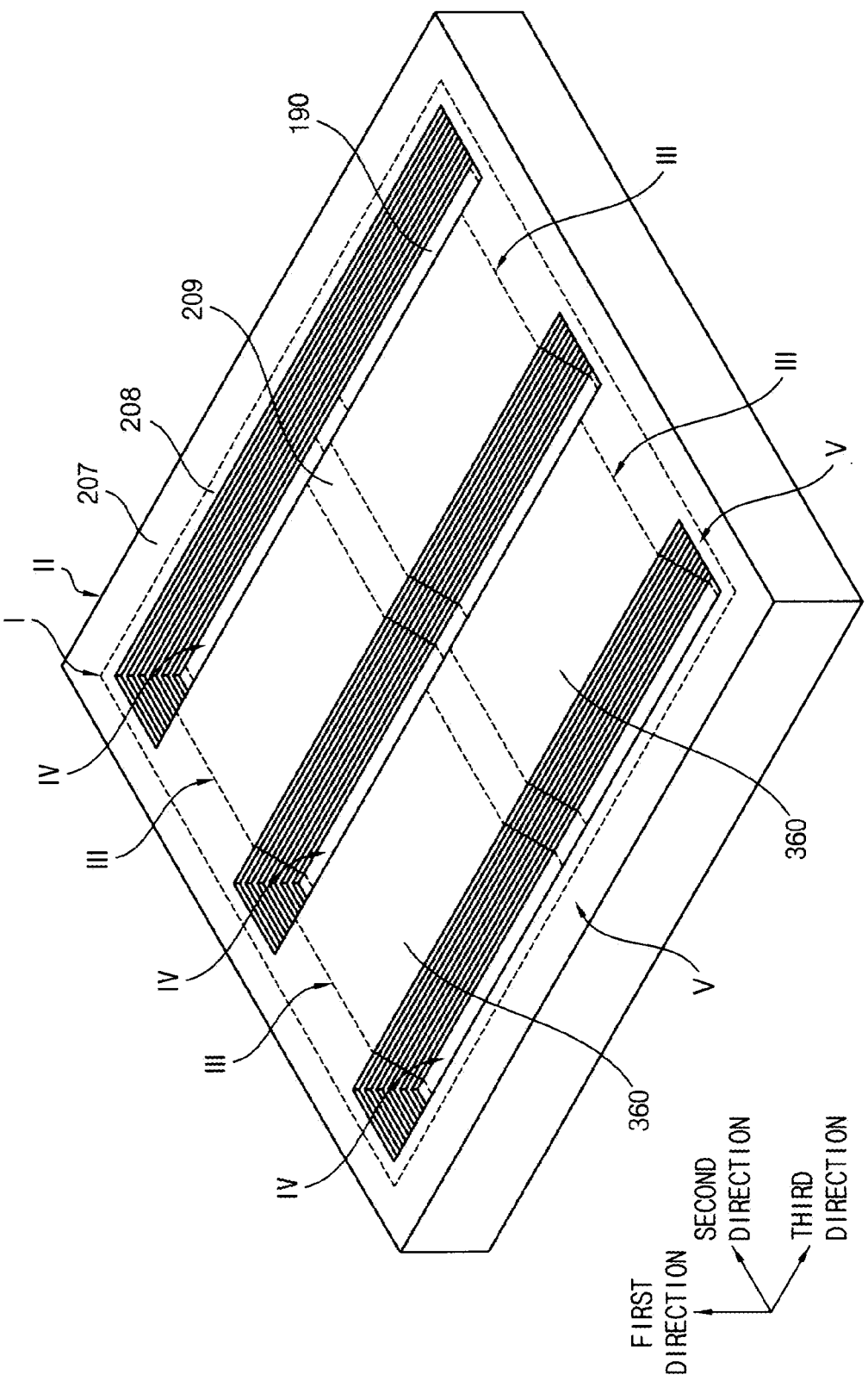
Figure 4:
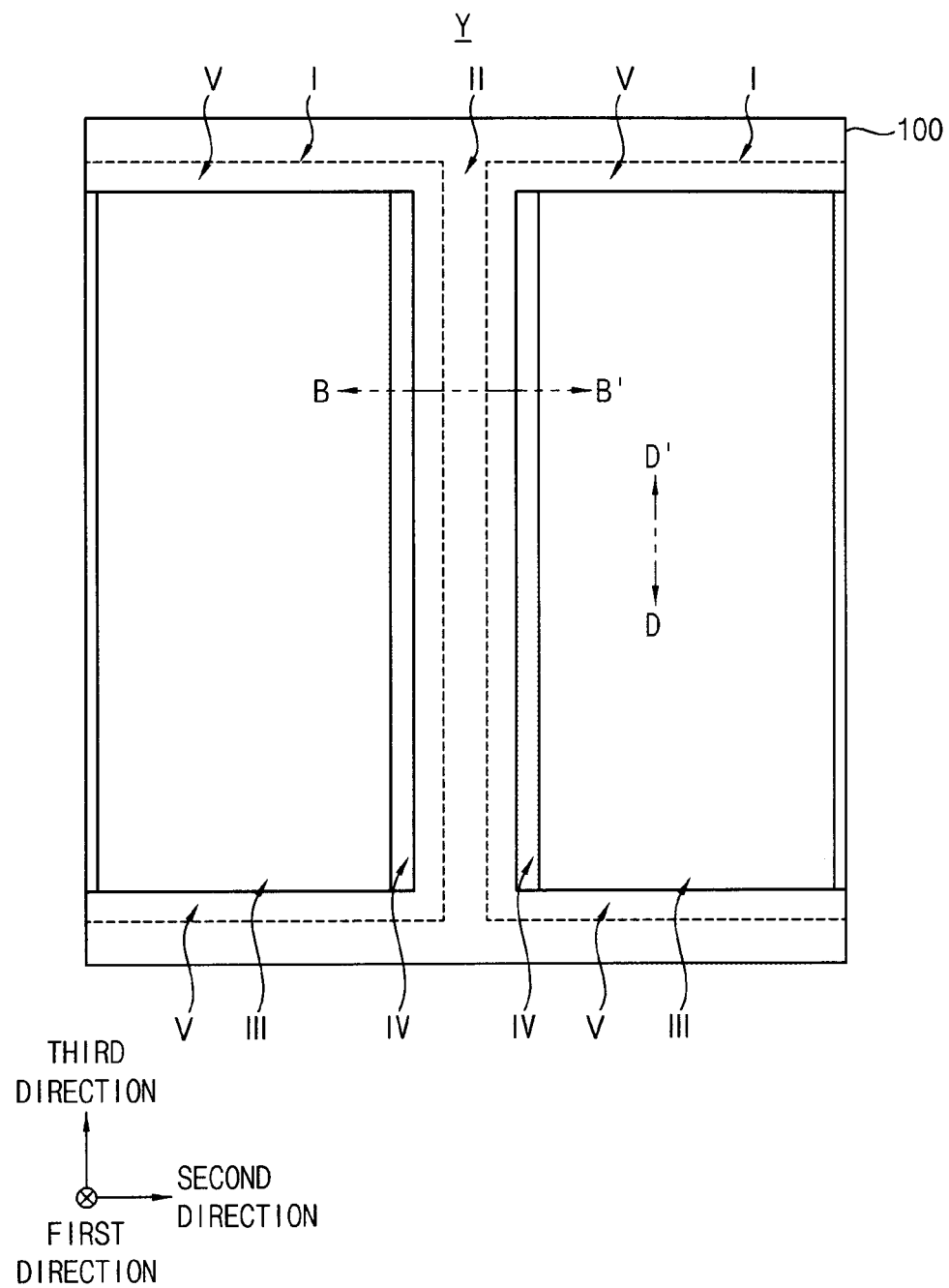
Figure 5:
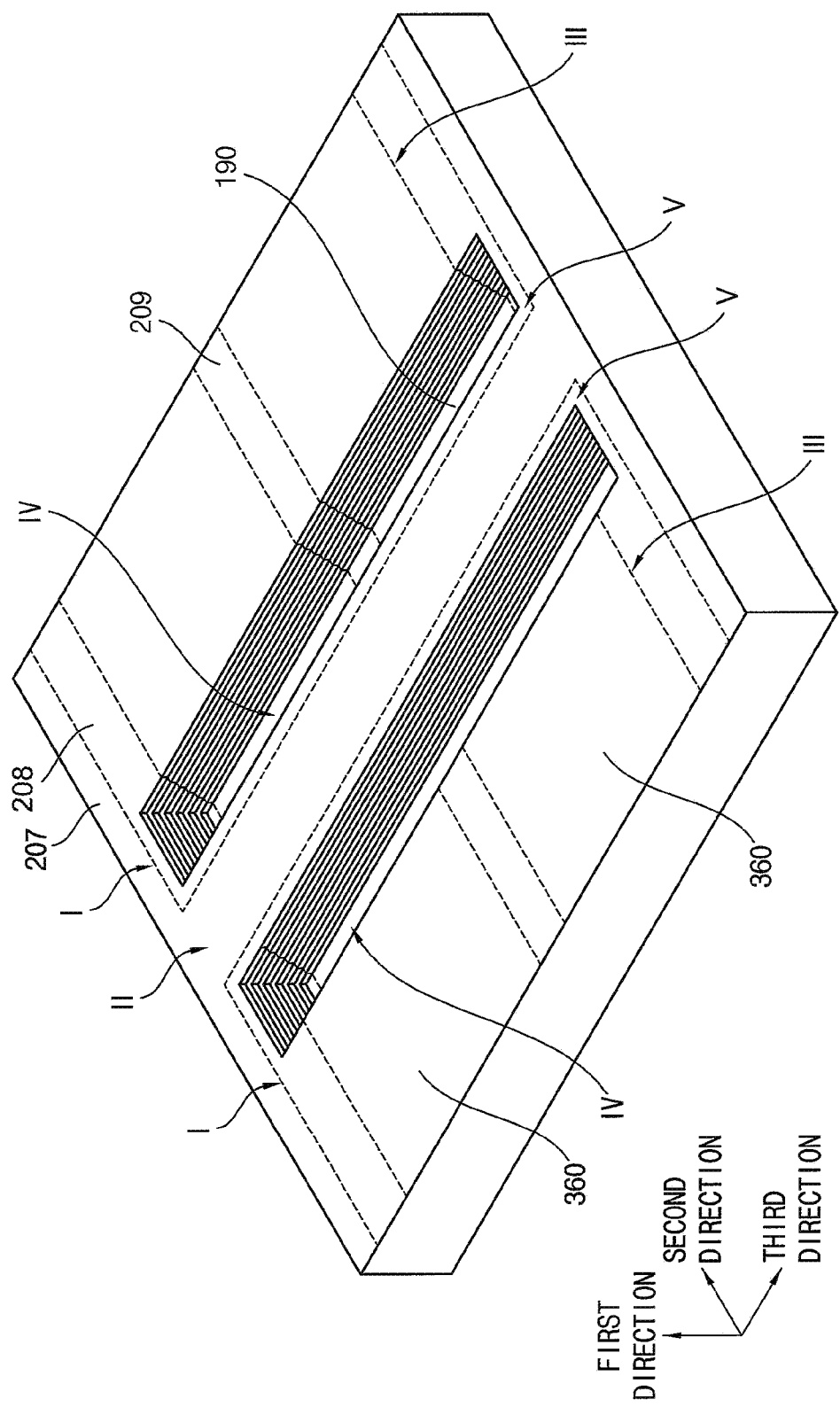

FIGS. 1 to 5 are plan views and perspective views illustrating a vertical memory device in accordance with example embodiments. Particularly, FIGS. 1, 2 and 4 are the plan views, and FIGS. 3 and 5 are the perspective views.

FIGS. 2 and 4 are plan views of regions X and Y of FIG. 1, respectively, and FIGS. 3 and 5 are perspective views of the regions X and Y of FIG. 1, respectively. In all of the perspective views including FIGS. 3 and 5, components such as insulating interlayer, capping patterns, CSP, etc., are not shown to avoid complexity of the drawings.

Referring to FIG. 1, a substrate 100 may include a first region I and a second region II surrounding the first region I. A plurality of first regions I of the substrate 100 may be formed along each of the second and third directions, and the second region II of the substrate 100 may be formed to surround each of the first regions I. For example, as illustrated in FIG. 1, the plurality of first regions I may be arranged to be spaced apart from each other in each of the second and third directions in a matric pattern.

The substrate 100 may include, e.g., silicon, germanium, silicon-germanium or a III-V compound such as GaP, GaAs, GaSb, etc. In some embodiments, the substrate 100 may be, e.g., a silicon-on-insulator (SOI) substrate or a germanium-on-insulator (GOI) substrate.

The first region I of the substrate 100 may be a chip region in which a semiconductor chip is formed, and the second region II of the substrate 100 may be a scribe lane (S/L) region that surrounds the chip region. In example embodiments, an alignment key for aligning an exposure mask used in a photolithography process to a correct position, a test element group (TEG) for detecting leakage current of the vertical memory device, etc., may be formed on the second region II of the substrate 100.

In example embodiments, the vertical memory device may have a cell over peri (COP) structure. That is, a circuit pattern for driving a memory cell formed in a cell region included in the first region I of the substrate 100 may not be formed around the memory cell, but may be formed under the memory cell. Accordingly, a circuit pattern region, i.e., where the circuit pattern is formed, and the cell region may be vertically stacked on the substrate 100, and the circuit pattern may be referred to as a lower circuit pattern. However, embodiments are not limited thereto, and even when the vertical memory device has a COP structure, a peripheral circuit region, i.e., where a portion of the circuit pattern is formed, may also be further formed around the cell region.

Referring to FIGS. 2 and 4, the first region I of the substrate 100 may include third to fifth regions III, IV and V. It is noted that FIG. 2 illustrates a detailed and enlarged plan view of region X of FIG. 1, i.e., a single first region I surrounded by a portion of the second region II, while FIG. 4 illustrates a detailed and enlarged plan view of region Y of FIG. 1, i.e., portions of two adjacent first regions I separated by a portion of the second region II.

Referring to FIGS. 2 and 4, the third region III of the substrate 100 may be a cell region where memory cells are formed. In example embodiments, a plurality of third regions III may be formed along each of the second and third directions on the substrate 100. For example, as illustrated in FIG. 2, two third regions III may be formed in one first region I to be adjacent to each other along the second direction.

Hereinafter, in the plan views illustrating the region X of FIG. 1, the third region III formed at the left side may be referred to as a first cell region, and the third region III formed at the right side may be referred to as a second cell region. Also, in the plan views illustrating the region Y of FIG. 1, the third region III formed at the left side may be referred to as a second cell region, and the third region III formed at the right side may be referred to as a third cell region.

The fourth region IV of the substrate 100 may be a through via region where through vias connected to the lower circuit pattern are formed, and may be formed on both sides of the third region III in the second direction. In example embodiments, a plurality of fourth regions IV of the substrate 100 may be formed along the second direction, and each of the fourth region IV of the substrate 100 may extend in the third direction.

The fifth region V of the substrate 100 may be a region surrounded by the second region II while surrounding the third and fourth regions III and IV. A mold may remain after a mold layer is patterned in the fifth region V of the substrate 100, so the fifth region V may be referred to as a mold region. The fifth region V of the substrate 100 may have a shape similar to a quadrangular ring in the plan view. In example embodiments, the fifth region V of the substrate 100 may surround both sides of the third region III in the third direction, one side of the fourth region IV in the second direction, and both sides of the fourth region IV in the third direction.

Referring to FIGS. 3 and 5, a gate electrode structure 360 may be formed on the third region III of the substrate 100, and a first mold 207 may be formed on the second region II and the fifth region V of the substrate 100. For example, as illustrated in FIG. 3, each gate electrode structure 360 may be between two trenches (i.e., between two fourth regions IV) along the second direction. For example, as illustrated in FIG. 3, the first mold 207 may surround each gate electrode structure 360, e.g., the first mold 207 may surround each gate electrode structure 360 and the trenches adjacent thereto.

Figure 18:
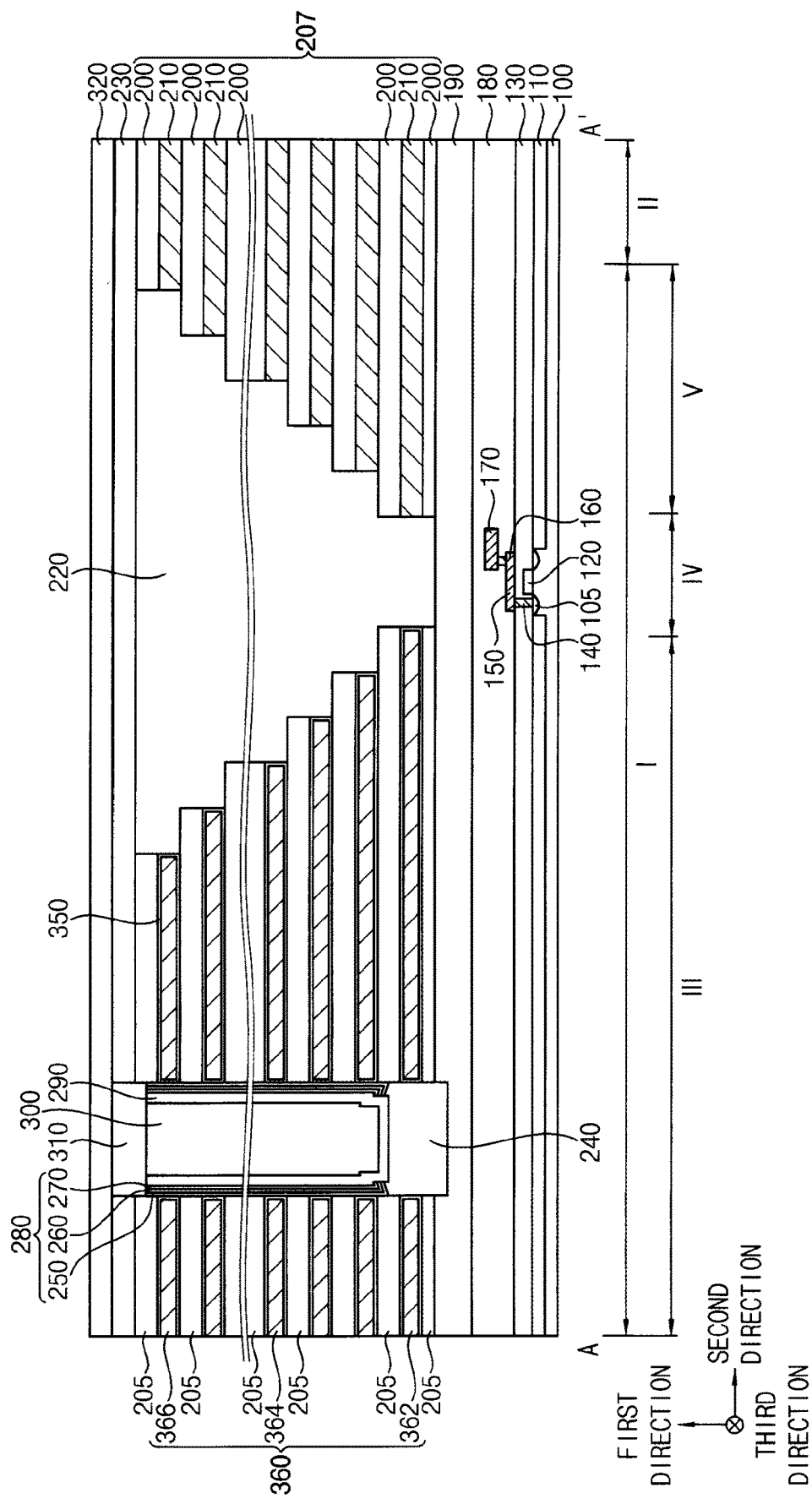
FIG. 18 illustrates a cross-sectional view along the line A-A' as shown in FIG. 1, after the formation of the second blocking layer.

In example embodiments, a portion of the gate electrode structure 360 and a portion of the first mold 207 surrounding the fourth region IV together may form a stair structure. For example, as illustrated in FIGS. 3 and 5, sidewalls of the gate electrode structure 360 and of the first mold 207 that face the fourth region IV may include a stair structure, e.g., a stair structure descending from a top of the gate electrode structure 360 toward its bottom. In example embodiments, the first mold 207 may be a stair structure toward the fourth region IV of the substrate 100 having a staircase shape with one insulation layer 200 (FIG. 18) and one sacrificial layer 210 (FIG. 18) sequentially stacked together as each stair-step layer, and the gate electrode structure 360 may be a stair structure having a staircase shape with each gate electrode as each stair-step layer. In the present specification, each layer of the stair structure is defined as a "stair-step layer", and a portion formed on each of both ends of the stair-step layer to be not overlapped by an upper stair-step layer in the first direction is defined as a "stair-step".

In example embodiments, the sacrificial layers 210 included in the stair-step layers of the first mold 207 may be formed at the same level as the stair-step layers of the gate electrode structure 360 corresponding thereto, and the slope of the sacrificial layers 210 included in the stair-step layers of the first mold 207 may be the same as the slope of the stair-step layers of the gate electrode structure 360. In example embodiments, the sacrificial layers 210 included in the stair-step layers of the first mold 207 may be connected with the stair-step layers of the gate electrode structure 360 corresponding thereto.

In example embodiments, a third mold 209 may be formed on a middle portion of the third region III of the substrate 100 in the third direction, and may extend in the second direction between the gate electrode structures 360 neighboring each other. The third mold 209 may include insulation patterns 205 (FIG. 13) and sacrificial patterns 215 (FIG. 13) alternately and repeatedly stacked along the first direction.

In example embodiments, similar to the first mold 207, the third mold 209 may also be a staircase shape with one insulation pattern 205 and one sacrificial pattern 215 sequentially stacked together as each stair-step layer. In example embodiments, the sacrificial patterns 215 included in the stair-step layers of the third mold 209 may be connected with the stair-step layers of the gate electrode structure 360 corresponding thereto.

The vertical memory device may include the first mold 207 remaining on each of the fifth region V that is formed on an edge of the first region I of the substrate 100 and the second region II that surrounds the first region I of the substrate 100. Thus, in a method of manufacturing the vertical memory device described later, the insulation layers 200 and the sacrificial layers 210 having a compressive force and a tensile force, respectively, may be repeatedly stacked on the fifth and second regions V and II of the substrate 100, so that a unilateral stress may not be applied to the substrate 100.

FIGS. 6 to 25 are plan views and cross-sectional views illustrating stages in a method of manufacturing a vertical memory device in accordance with example embodiments. Particularly, FIGS. 7-8, 12 and 17 are plan views, and FIGS. 6, 9-11, 13-16 and 18-25 are cross-sectional views.

Figure 6:
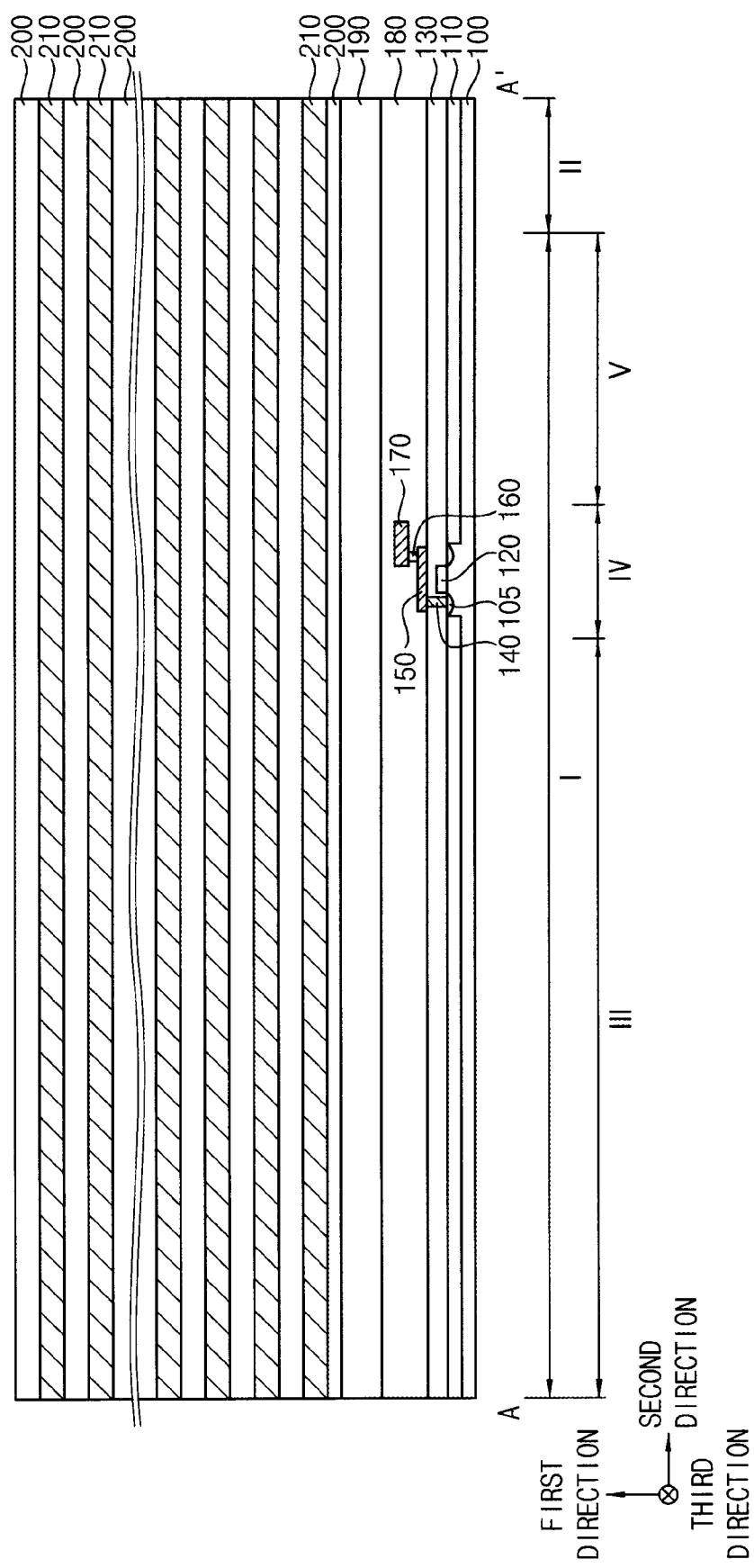
FIG. 6 illustrates a cross-sectional view along the line A-A' as shown in FIG. 1, after the formation of the insulating layers and the sacrificial layers.
Figure 7:
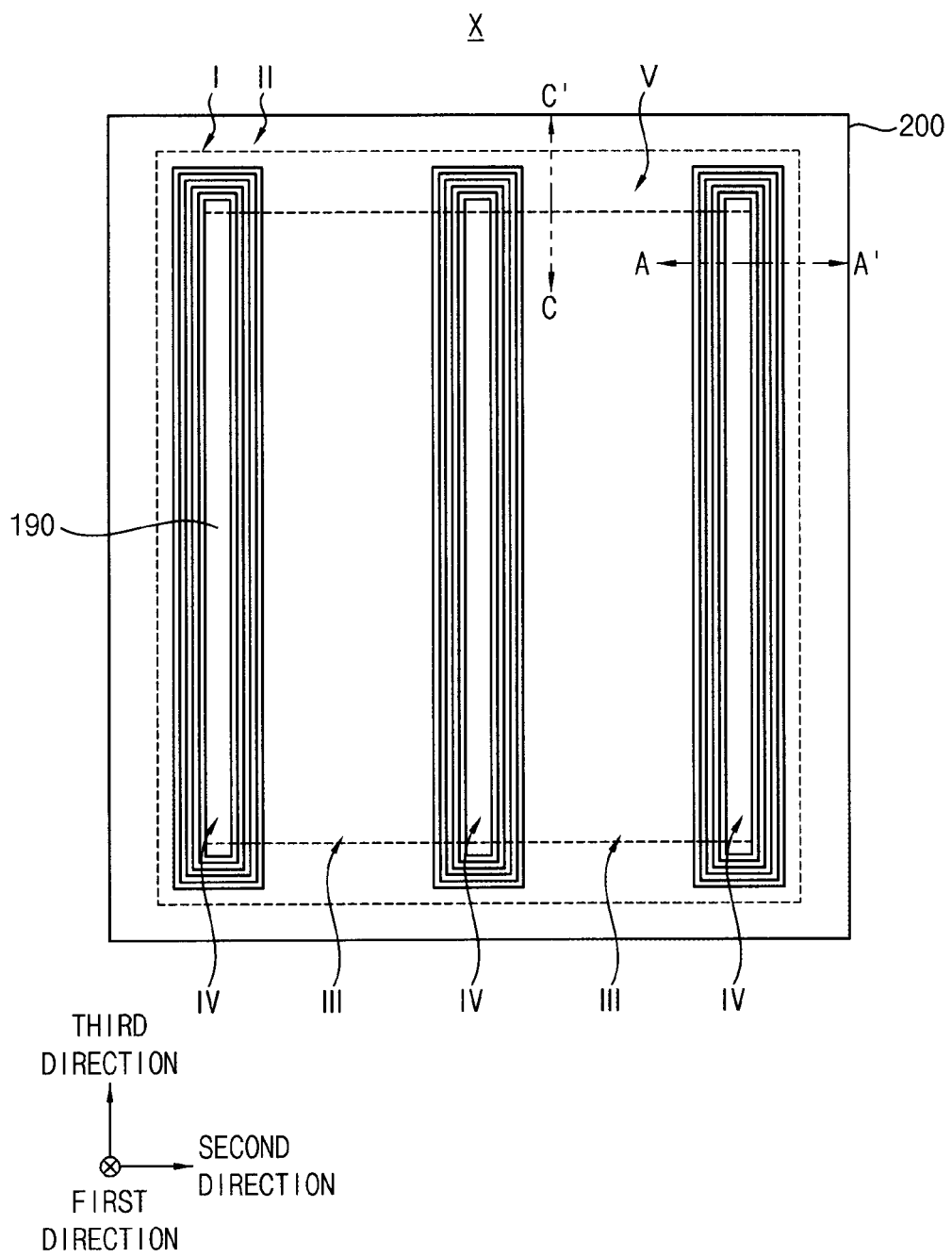
FIG. 7 illustrates a plan view along the region X as shown in FIG. 1, after the formation of the photoresist pattern.
Figure 8:
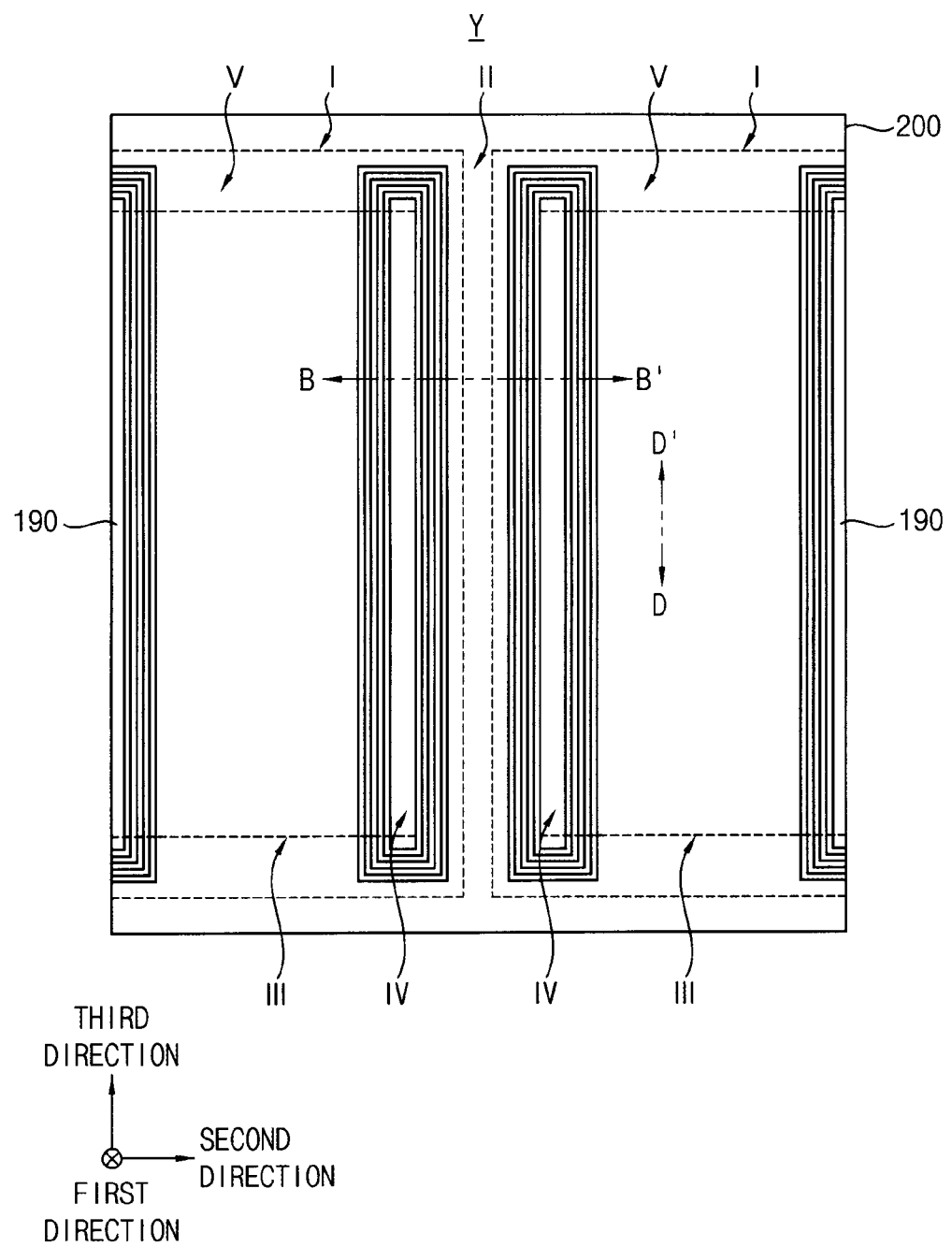
FIG. 8 illustrates a plan view along the region Y as shown in FIG. 1, after the formation of the photoresist pattern.
Figure 11:
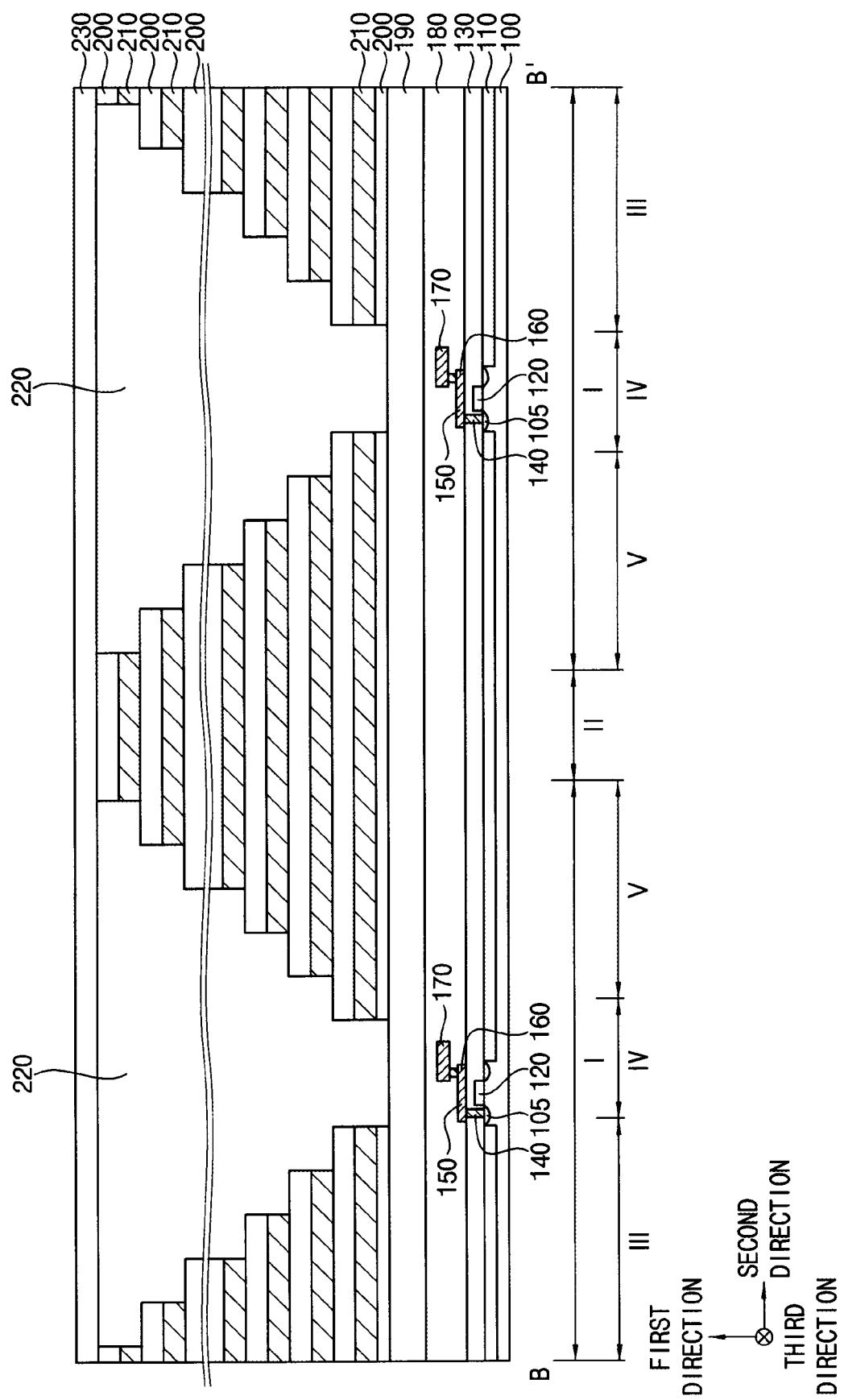
FIG. 11 illustrates a cross-sectional view along the line B-B' as shown in FIG. 8.
Figure 12:
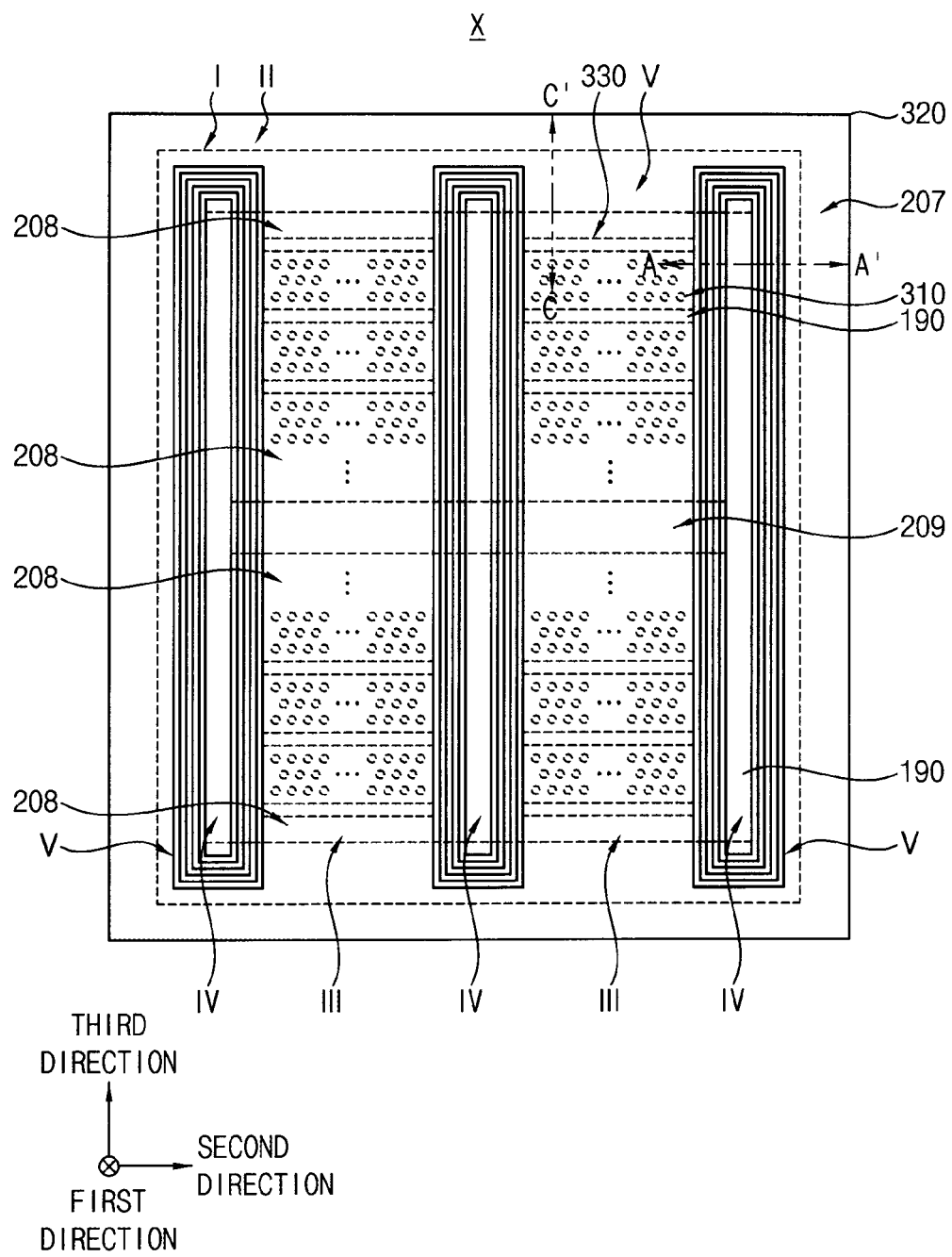
FIG. 12 illustrates a plan view along the region X as shown in FIG. 1, after the formation of the first mask.
Figure 16:
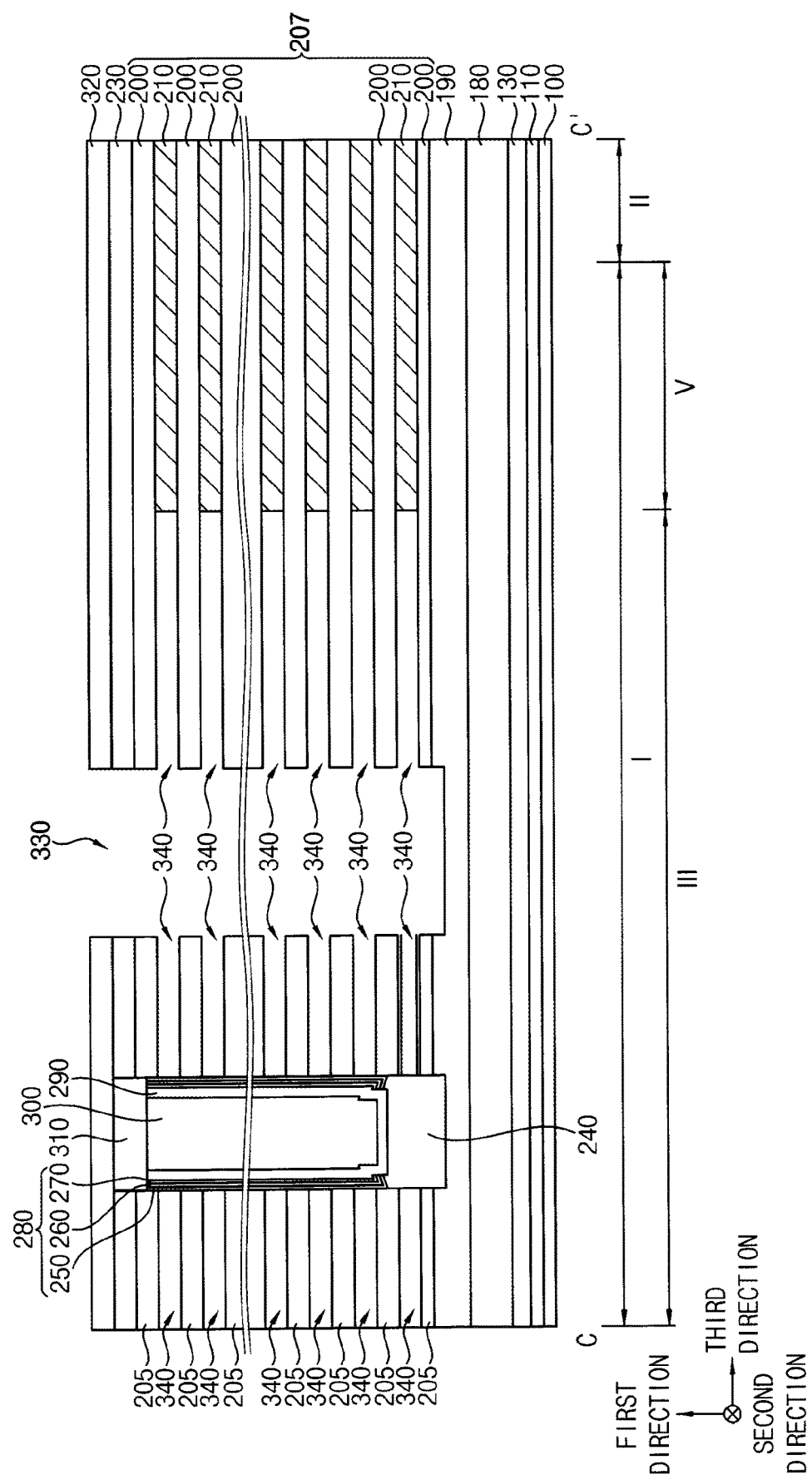
FIG. 16 illustrates a cross-sectional view along the line C-C' as shown in FIG. 1, after the removal of the second mask.
Figure 17:
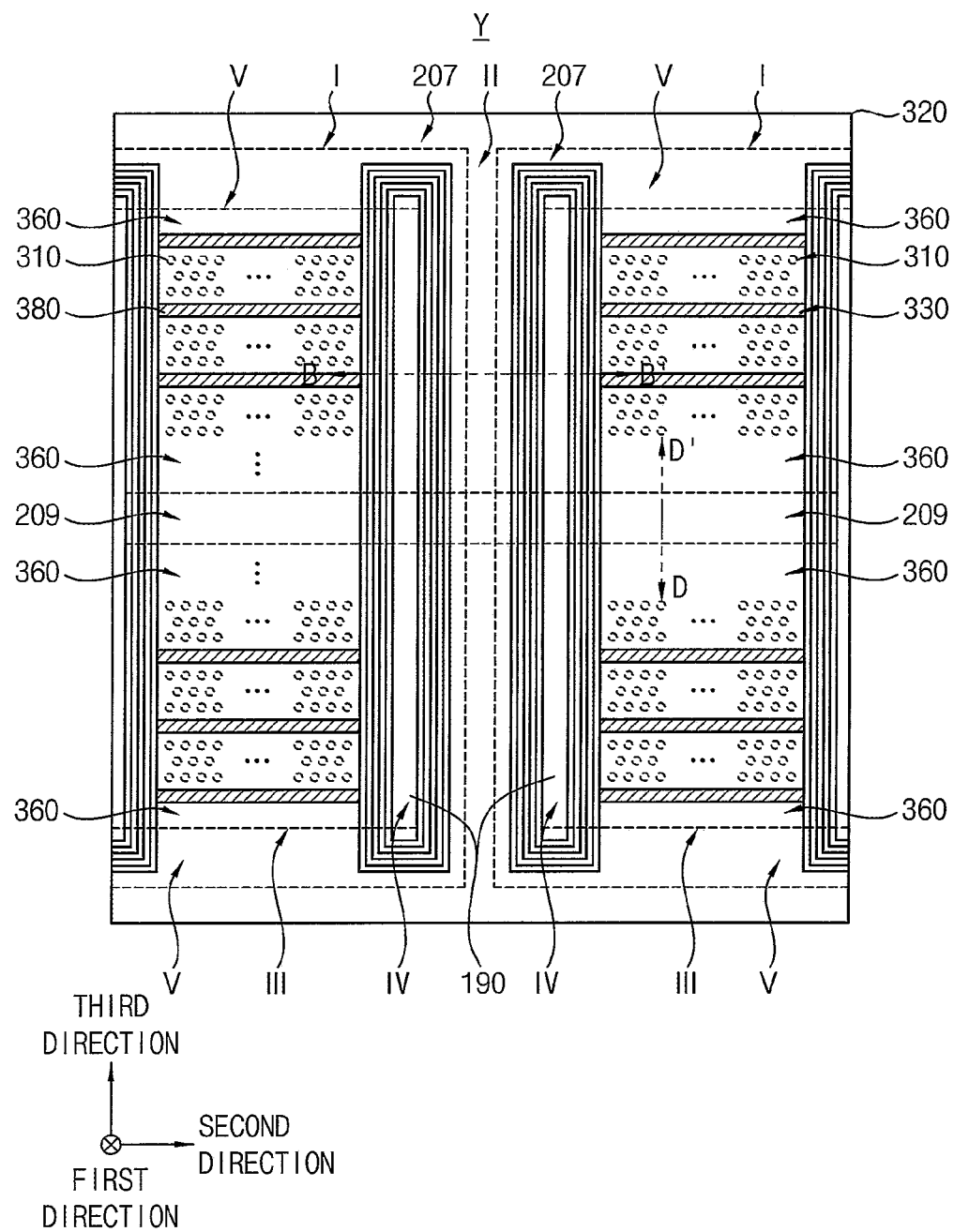
FIG. 17 illustrates a plan view of region Y as shown in FIG. 1, after the formation of the second blocking layer.
Figure 19:
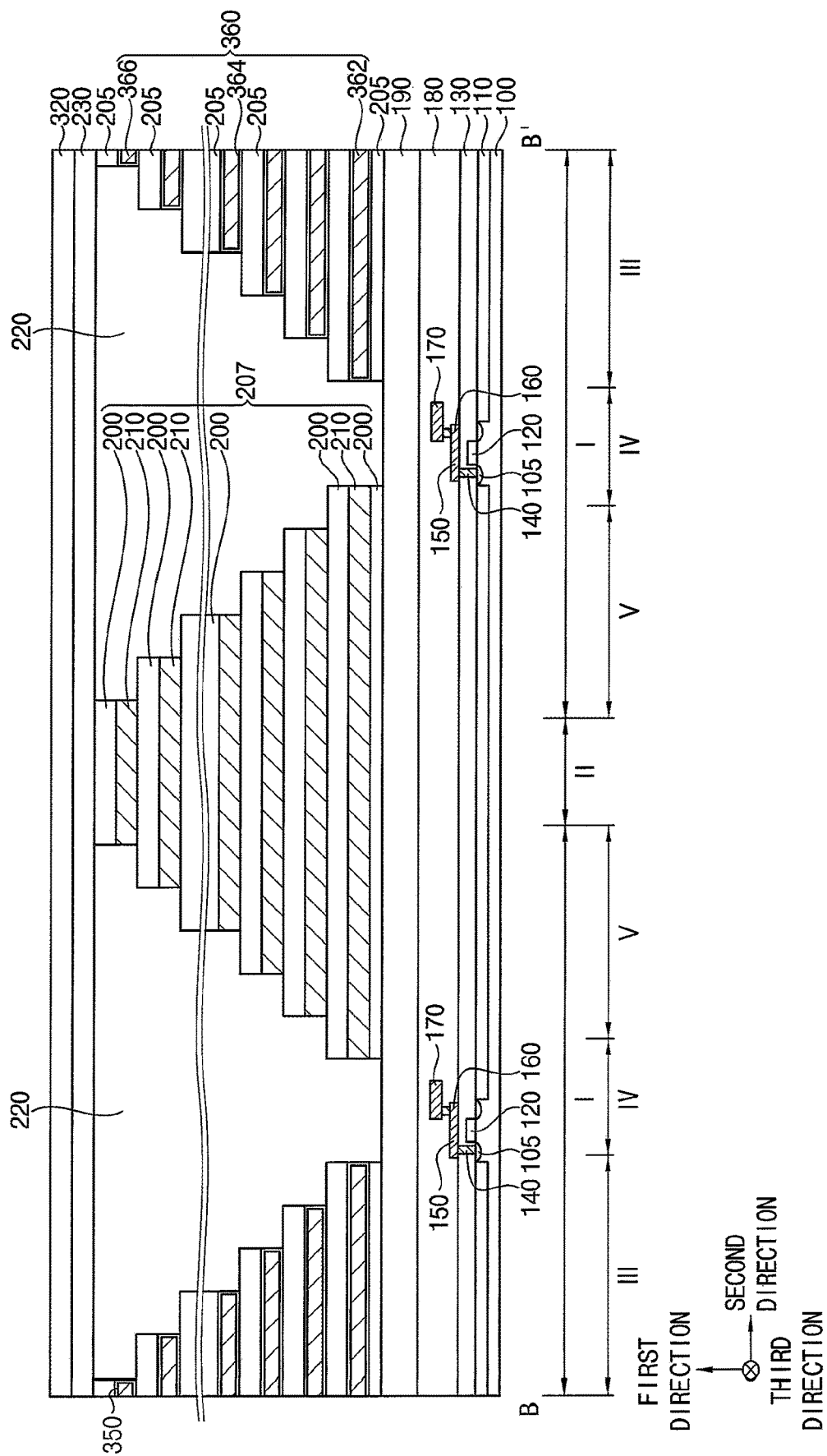
FIG. 19 illustrates a cross-sectional view along the line B-B' as shown in FIG. 1, after the formation of the second blocking layer.
Figure 20:
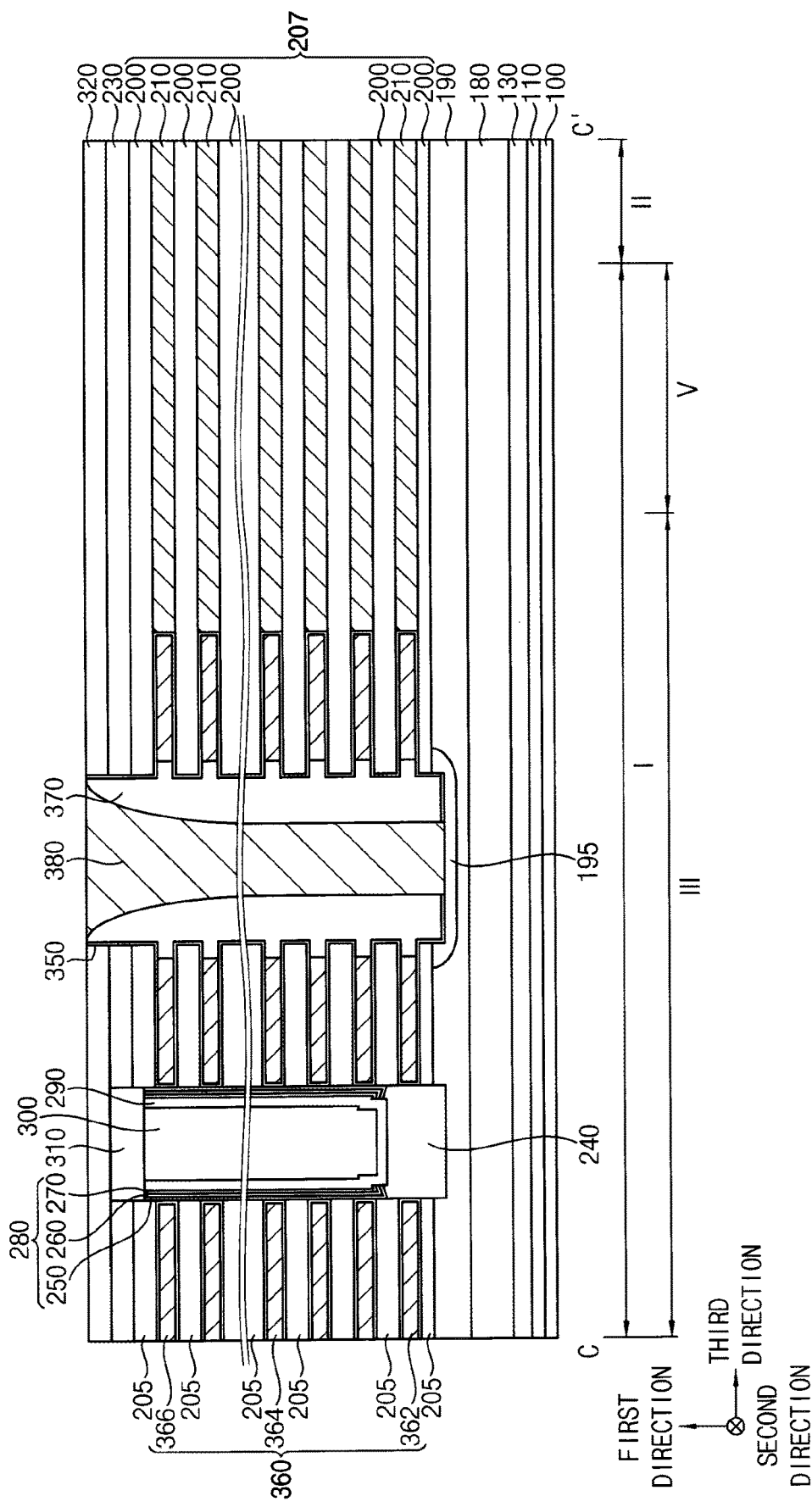
FIG. 20 illustrates a cross-sectional view along the line C-C' as shown in FIG. 1, after the formation of the second blocking layer.
Figure 21:
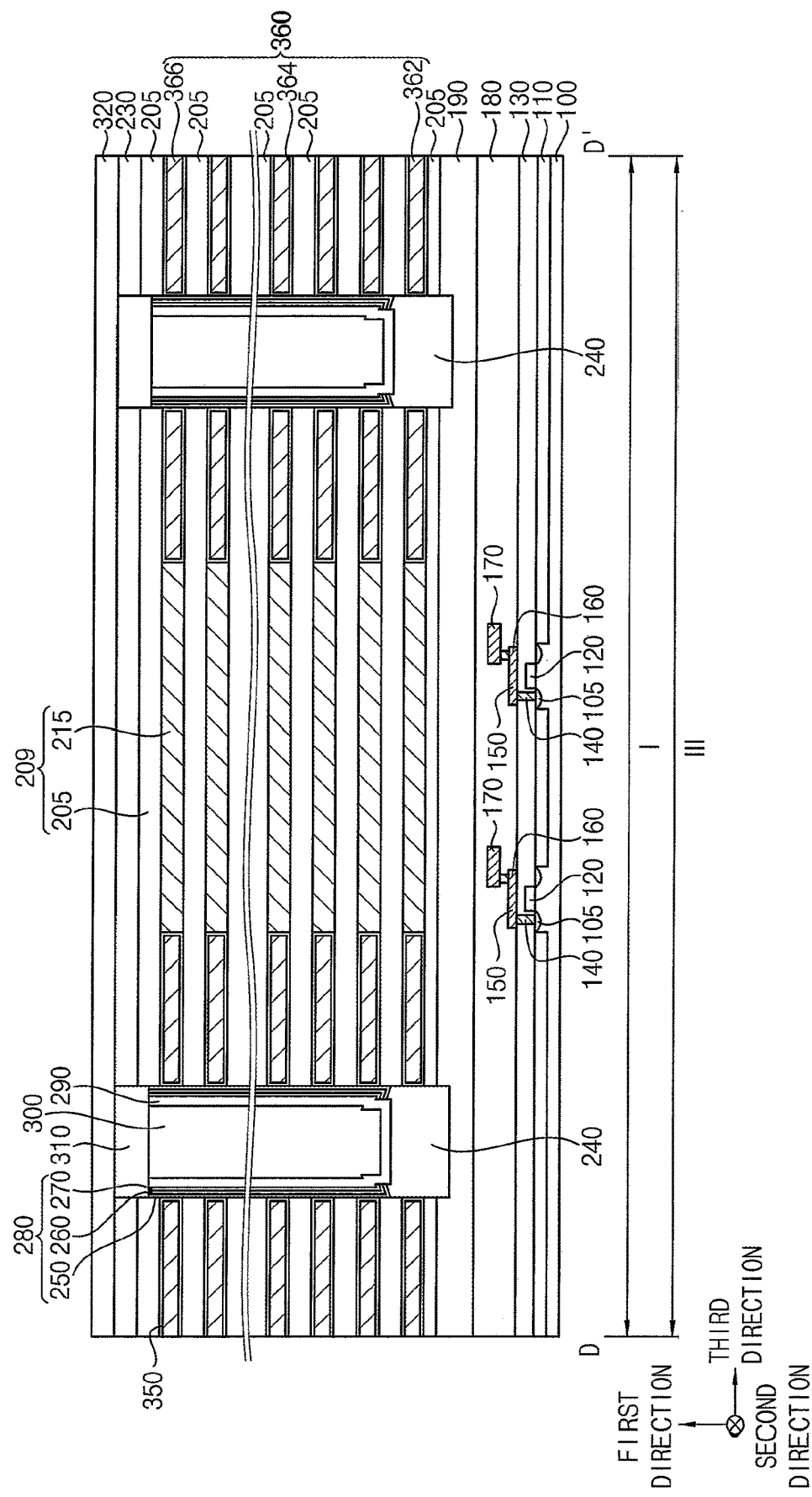
FIG. 21 illustrates a cross-sectional view along the line D-D' as shown in FIG. 1, after the formation of the second blocking layer.
Figure 22:
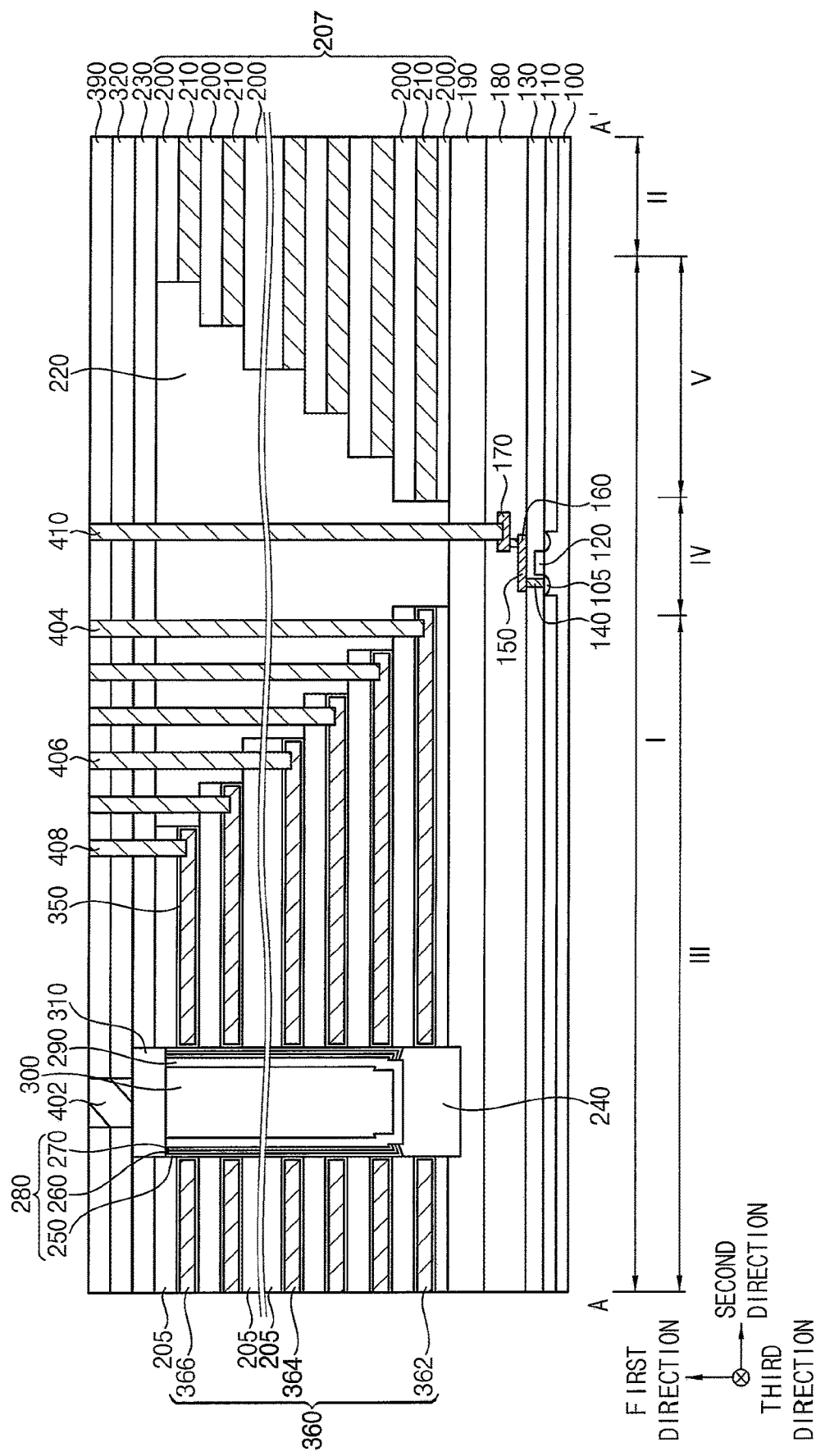
FIG. 22 illustrates a cross-sectional view along the line A-A' as shown in FIG. 1, after the formation of the fourth insulating layer.
Figure 23:
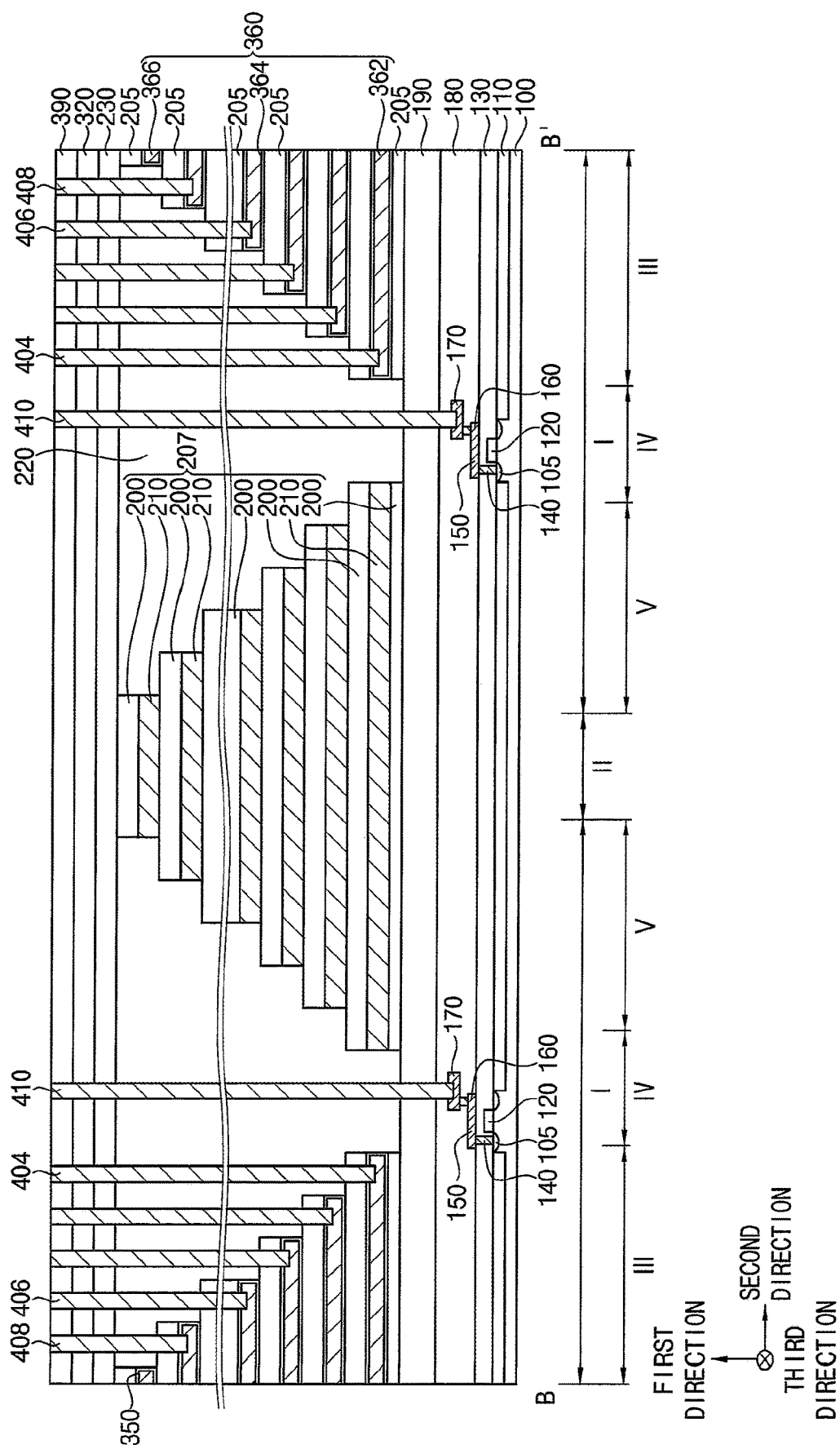
FIG. 23 illustrates a cross-sectional view along the line B-B' as shown in FIG. 1, after the formation of the fourth insulating layer.
Figure 24:
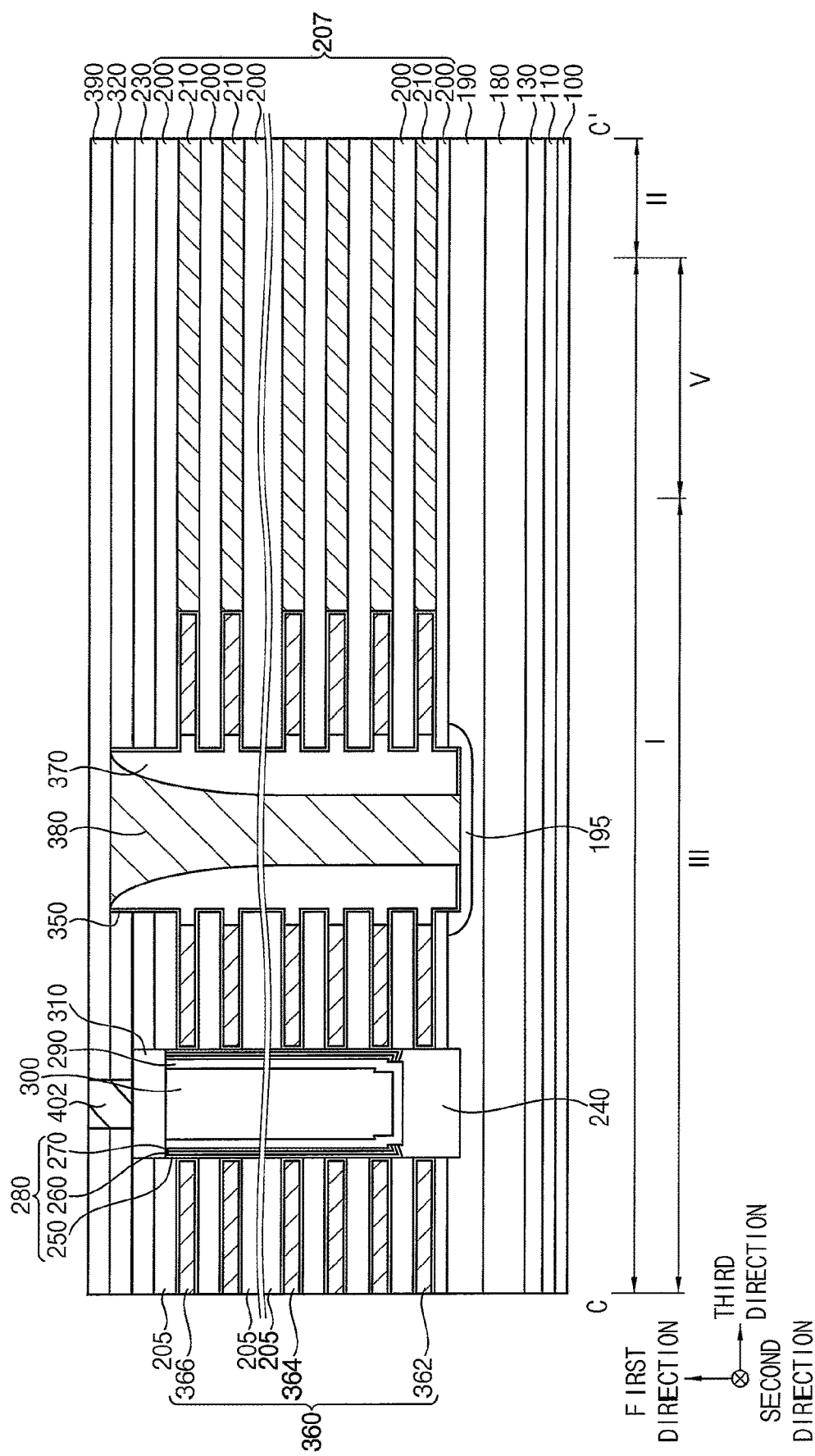
FIG. 24 illustrates a cross-sectional view along the line C-C' as shown in FIG. 1, after the formation of the fourth insulating layer.
Figure 25:
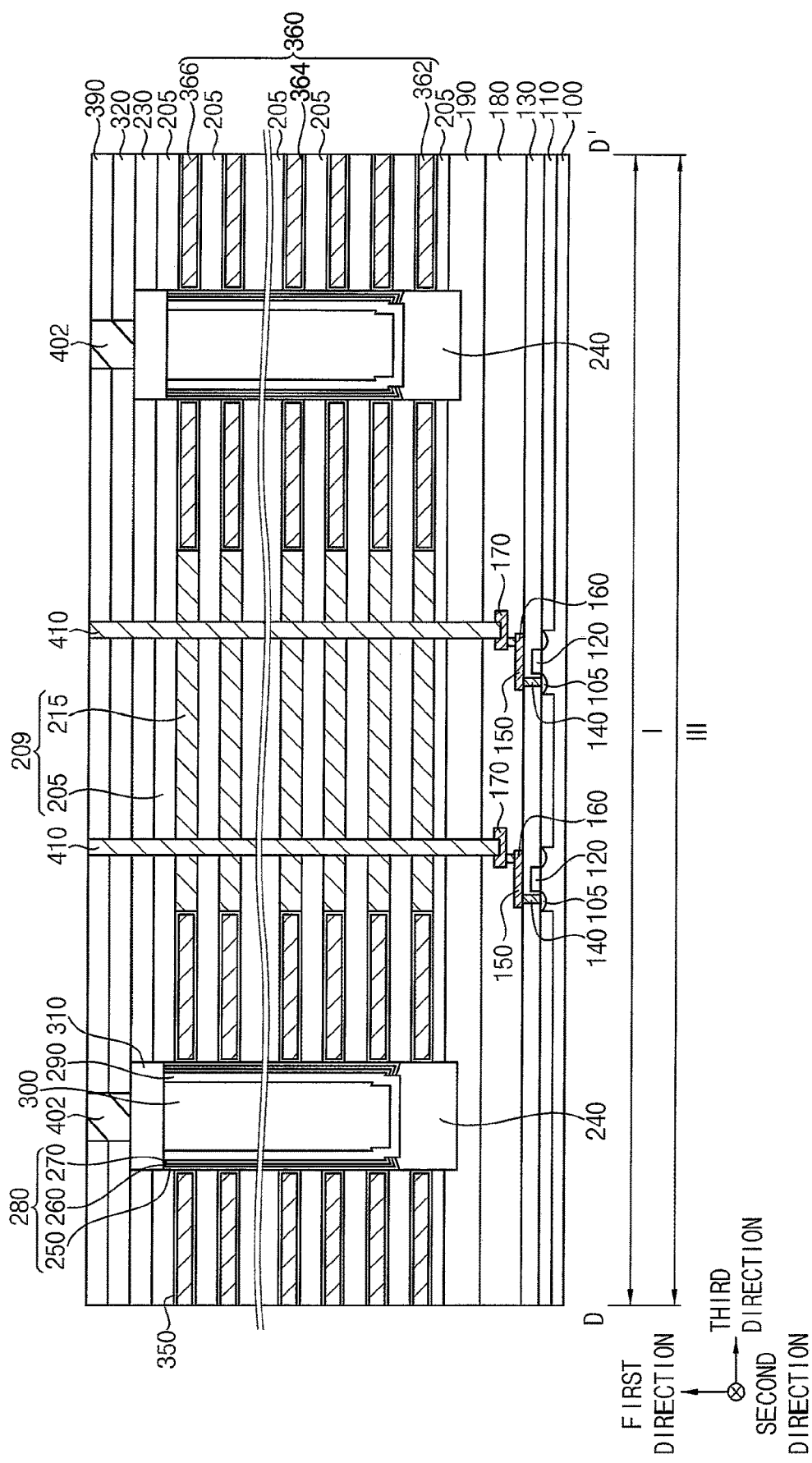
FIG. 25 illustrates a cross-sectional view along the line D-D' as shown in FIG. 1, after the formation of the fourth insulating layer.

FIGS. 7 and 12 are plan views of the region X of FIG. 1, FIGS. 8 and 17 are plan views of the region Y of FIG. 1. FIGS. 6, 9-10, 13, 15, 18 and 22 are cross-sectional views taken along line A-A' of corresponding plan views, FIGS. 11, 19 and 23 are cross-sectional views taken along line B-B' of corresponding plan views, FIGS. 14, 16, 20 and 24 are cross-sectional views taken along line C-C' of corresponding plan views, and FIGS. 21 and 25 are cross-sectional views taken along line D-D' of corresponding plan views.

Referring to FIG. 6, a circuit pattern may be formed on the substrate 100, and first and second lower insulating interlayers 130 and 180 may be sequentially formed on the substrate 100 to cover the circuit pattern. The substrate 100 may include an active region and a field region, e.g., an isolation pattern 110, surrounding the active region. The isolation pattern 110 may be formed by a STI process, and may include, e.g., an oxide. The circuit pattern may include a transistor, a lower contact plug 140, first and second lower wirings 150 and 170, a lower via 160, etc.

For example, the transistor in the circuit pattern may include a lower gate structure 120, and a first impurity region 105 formed on an upper portion of the active region adjacent thereto. In example embodiments, the lower gate structure 120 may include a lower gate insulation pattern, a lower gate electrode, and a lower gate mask sequentially stacked on the substrate 100.

The first lower insulating interlayer 130 may be formed on the substrate 100 to cover the transistor, and the lower contact plug 140 may extend through the first insulating interlayer 130 to contact the first impurity region 105 or the lower gate structure 120. The first lower wiring 150 may be formed on the first lower insulating interlayer 130 to contact an upper surface of the lower contact plug 140. The first lower via 160 and the second lower wiring 170 may be sequentially stacked on the first lower wiring 150. The second lower insulating interlayer 180 may be formed on the first lower insulating interlayer 130 to cover the first and second lower wirings 150 and 170, and the first lower via 160.

FIG. 6 illustrates that the circuit pattern is formed only on the fourth region IV of the substrate 100. However, embodiments are not limited thereto. That is, a plurality of circuit patterns may be formed on the first to fifth regions I, II, III, IV and V of the substrate 100 along each of the second and third directions.

A base pattern 190 may be formed on the second lower insulating interlayer 180, and insulation layers 200 and sacrificial layers 210 may be alternately and repeatedly stacked on the base pattern 190 to form a mold layer. The base pattern 190 may include a semiconductor material, e.g., silicon, the insulation layers 200 may include an oxide, e.g., silicon oxide, and the sacrificial layers 210 may include a material having an etching selectivity with respect to the insulation layer 200, e.g., a nitride such as silicon nitride.

Figure 9:
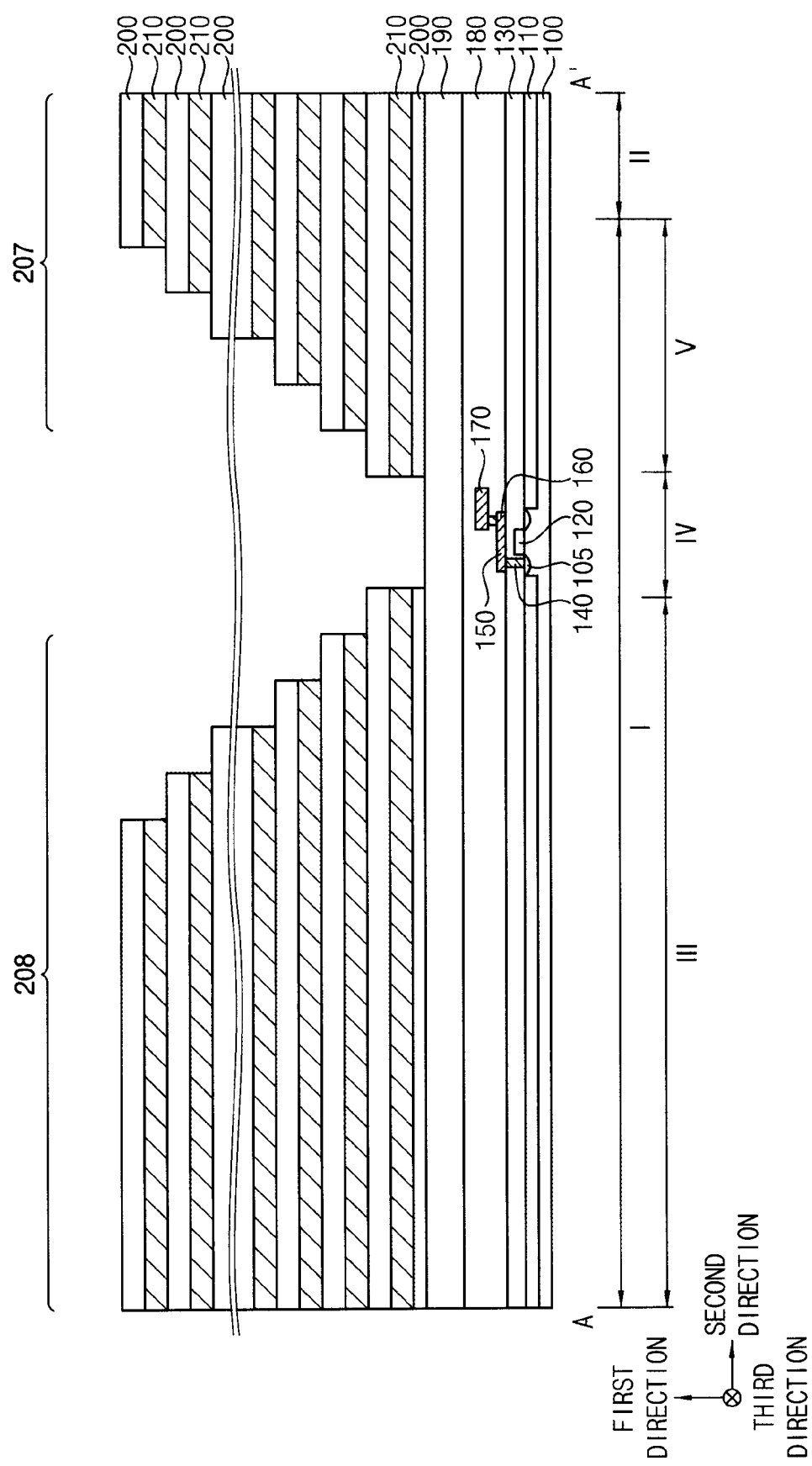
FIG. 9 illustrates a cross-sectional view along the line A-A' as shown in FIG. 1 after the formation of the first opening.

Referring to FIGS. 7 to 9, a first photoresist pattern that covers the first and second regions I and II of the substrate, but does not cover the fourth region IV of the substrate 100 may be formed on an uppermost one of the insulation layers 200. An etching process using the first photoresist pattern as an etching mask and a trimming process for reducing an area of the first photoresist pattern may be alternately and repeatedly performed to etch the mold layer.

The first photoresist pattern may include a first opening exposing only the fourth region IV of the substrate 100, and the first opening may be expanded in size as the trimming process is repeatedly performed. Accordingly, the first opening of the first photoresist pattern may be expanded to gradually expose more portions of the third and fifth regions III and V being adjacent and surrounding the fourth region IV whenever the trimming process is repeatedly performed, e.g., to form a trench with the stair-shaped sidewalls in FIGS. 7 and 9. After the etching process and the trimming process, the first photoresist pattern may be removed by, e.g., an ashing process and/or a stripping process.

After the etching process to the mold layer, the first mold 207 may remain on the second region II and the fifth region V of the substrate 100, i.e., the stair structure of the mold on the right side of FIG. 9, and a second mold 208 may remain on the third region III of the substrate 100, i.e., the stair structure of the mold on the left side of FIG. 9. The first and second molds 207 and 208 may be in contact to be connected with each other at a boundary between the third region III and the fifth region V of the substrate 100, e.g., the first and second molds 207 and 208 may be connected with each other at a short side of the trench formed in the fourth region IV illustrated in FIG. 7. The base pattern 190 may be exposed on the fourth region IV of the substrate by the first opening, e.g., the base pattern 190 may be exposed on the fourth region IV between the first and second molds 207 and 208 (FIG. 9).

In example embodiments, the second mold 208 may be a stair structure having a staircase shape with one insulation layer 200 and one sacrificial layer 210 sequentially stacked together as each stair-step layer, and a portion of the first mold 207 corresponding thereto may also be a stair structure having a staircase shape with one insulation layer 200 and one sacrificial layer 210 sequentially stacked together as each stair-step layer. In addition, portions of the first and second molds 207 and 208, which are formed on portions of the third region III and the fifth region V adjacent to the fourth region IV of the substrate 100, together may be a stair structure having a staircase shape, e.g., completely, surrounding, e.g., a perimeter of, the fourth region IV.

In example embodiments, the stair structure formed by the portions of the first and second molds 207 and 208 that surround the fourth region IV together may have a quadrangular ring shape in which the size gradually decreases toward a center of the fourth region IV in the plan view. For example, a distance between opposite sides of the quadrangular ring shape may gradually decreases, e.g., a distance between corresponding opposite stairs in the first and second molds 207 and 208 may decrease, as a distance from the base pattern 190 along the first direction decreases.

Figure 10:
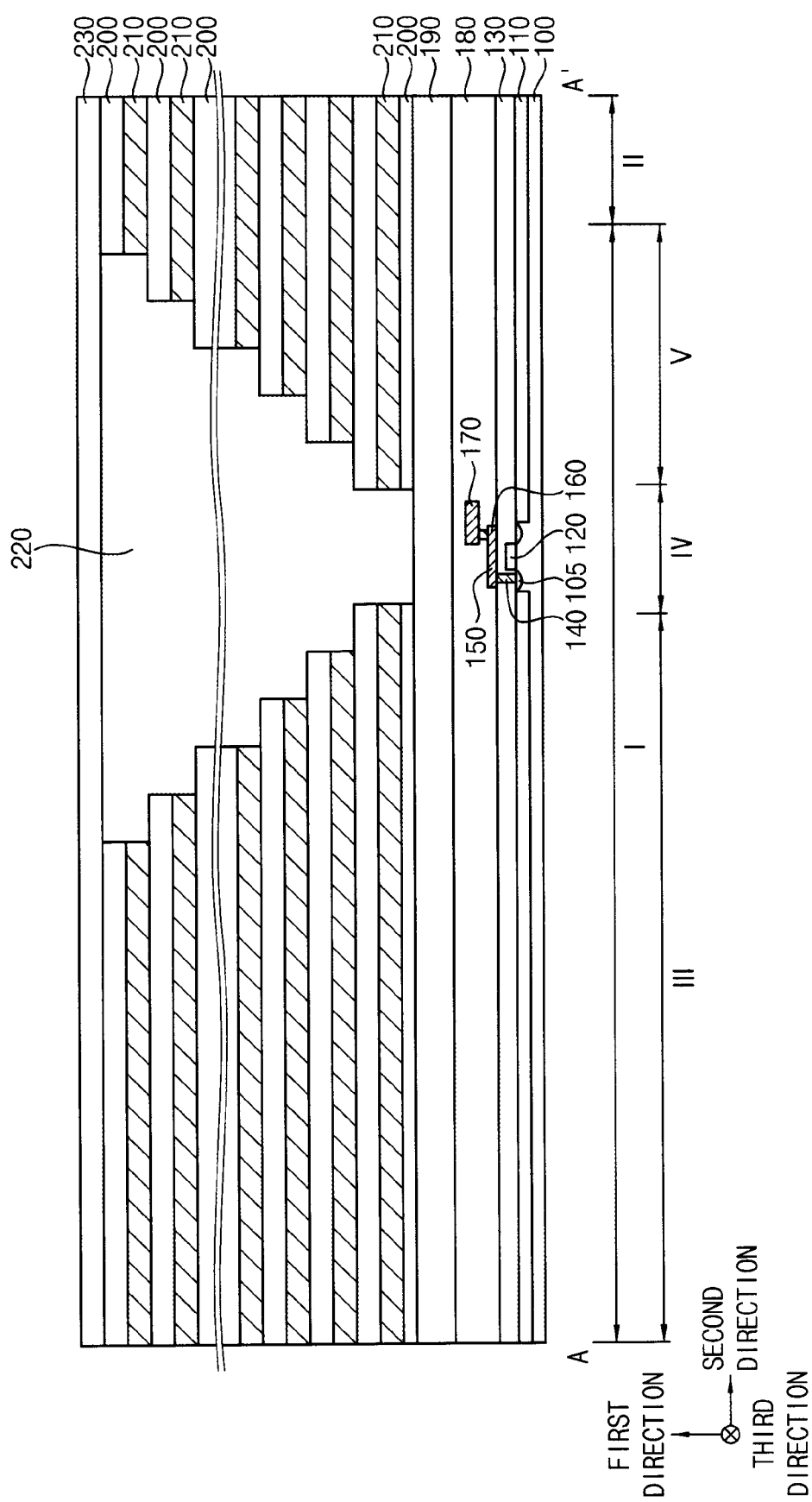
FIG. 10 illustrates a cross-sectional view along the line A-A' as shown in FIG. 1 after formation of the first insulating layer.

Referring to FIGS. 10 and 11, a first insulating interlayer 220 may be formed on the base pattern 190 to cover sidewalls of the first and second molds 207 and 208, e.g., the first insulating interlayer 220 may completely fill the trench with the stair-shaped sidewalls in FIGS. 7 and 9. A second insulating interlayer 230 may be formed on an upper surface of the uppermost one of the insulation layers 200 and an upper surface of the first insulating interlayer 220. The first and second insulating interlayers 220 and 230 may include an oxide, e.g., silicon oxide, and may be merged with the insulation layer 200 or with each other.

Figure 14:
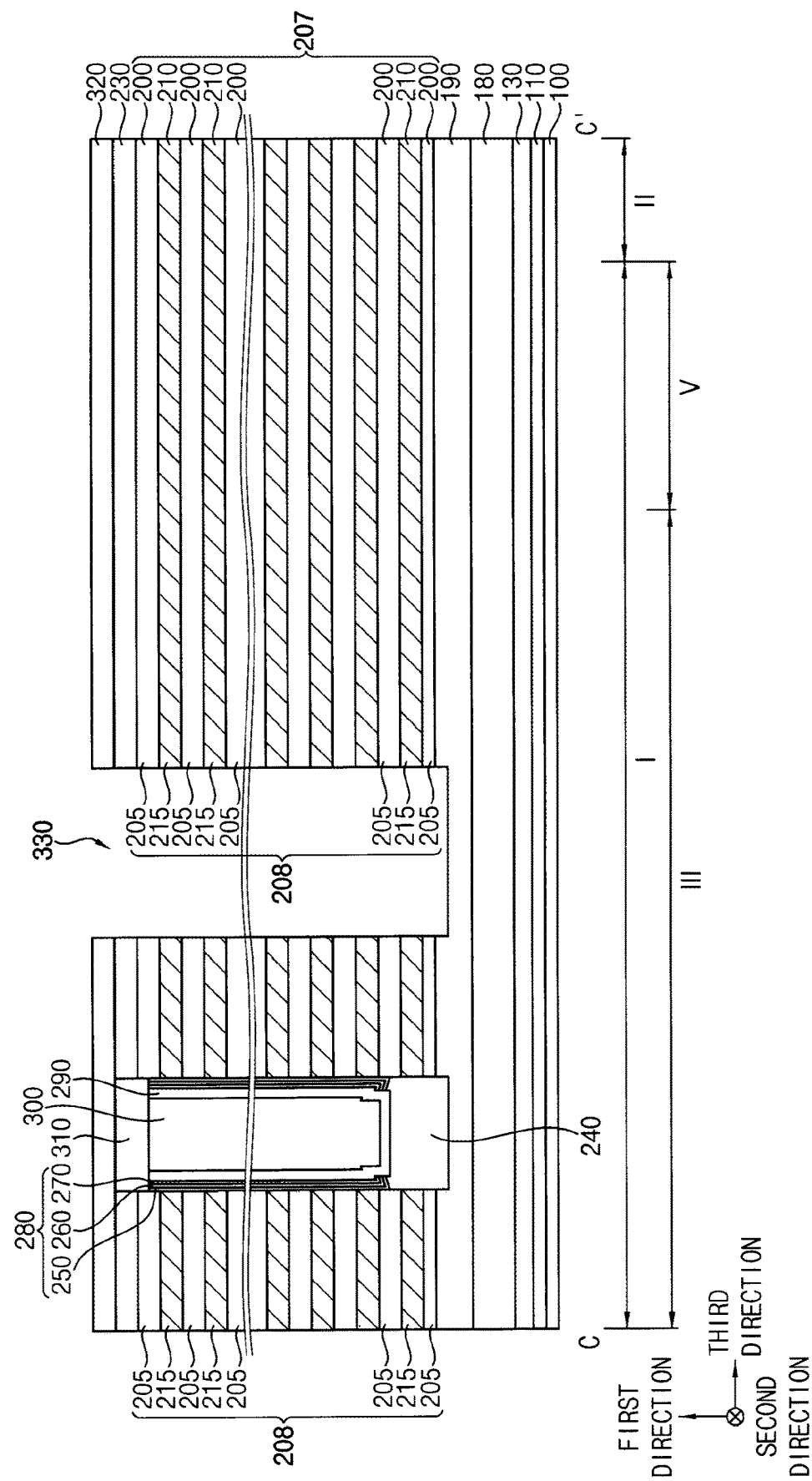
FIG. 14 illustrates a cross-sectional view along the line C-C' as shown in FIG. 12.

Referring to FIGS. 12 and 14, a first mask may be formed on the second insulating interlayer 230, and the second insulating interlayer 230, as well as the insulation layers 200 and the sacrificial layers 210 on the third region III of the substrate 100, may be etched using the first mask as an etching mask. Accordingly, a channel hole may be formed to extend through the second insulating interlayer 230, the insulation layers 200, and the sacrificial layers 210 to expose an upper surface of the base pattern 190.

A pillar structure filling the channel hole may be formed. That is, after removing the first mask, a selective epitaxial growth (SEG) process using the upper surface of the base pattern 190 exposed by the channel hole as a seed may be performed to form a semiconductor pattern 240 partially filling the channel hole. In example embodiments, an upper surface of the semiconductor pattern 240 may be disposed between an upper surface and a lower surface of the insulation layer 200 at a second level from the upper surface of the base pattern 190 in the first direction among the insulation layers 200. In some cases, the process of forming the semiconductor pattern 240 may be omitted.

A first blocking layer, a charge storage layer, a tunnel insulation layer, and a first spacer layer may be sequentially formed on a sidewall of the channel hole, an upper surface of the semiconductor pattern 240, and an upper surface of the second insulating interlayer 230. The first spacer layer may be anisotropically etched to form a first spacer remaining only on the sidewall of the channel hole, and the first blocking layer, the charge storage layer, and the tunnel insulation layer may be etched using the first spacer as an etching mask to form a first blocking pattern 250, a charge storage pattern 260, and a tunnel insulation pattern 270, respectively, on the semiconductor pattern 240 and the sidewall of the channel hole. An upper portion of the semiconductor pattern 240 may be also removed together therewith. Each of the first blocking pattern 250, charge storage pattern 260, and tunnel insulation pattern 270 may have a cup shape of which a center portion is penetrated, and the first blocking pattern 250, the charge storage pattern 260, and the tunnel insulation pattern 270 together may form a charge storage structure 280. The first spacer layer may include a nitride, e.g., silicon nitride, the tunnel insulation pattern 270 and the first blocking pattern 250 may include an oxide, e.g., silicon oxide, and the charge storage pattern 260 may include a nitride, e.g., silicon nitride.

After removing the first spacer, a channel layer may be formed on the exposed semiconductor pattern 240, tunnel insulation pattern 270, and second insulating interlayer 230, and a filling layer may be formed on the channel layer to fill a remaining portion of the channel hole. The filling layer and the channel layer may be planarized until the upper surface of the second insulating interlayer 230 is exposed.

A filling pattern 300 may be formed to fill the remaining portion of the channel hole, and the channel layer may be transformed into a channel 290. In example embodiments, a plurality of channels 290 may be formed along each of the second and third directions on the third region III of the substrate 100, and together may form a channel block and a channel array.

Upper portions of the filling pattern 300, the channel 290, and the charge storage structure 280 may be removed to form a trench, and a capping pattern 310 may be formed to fill the trench. Accordingly, the pillar structure including the semiconductor pattern 240, the channel 290, the charge storage structure 280, the filling pattern 300, and the capping pattern 310 may be formed in the channel hole. The channel 290 and the capping pattern 310 may include doped or undoped amorphous silicon or polysilicon.

Figure 13:
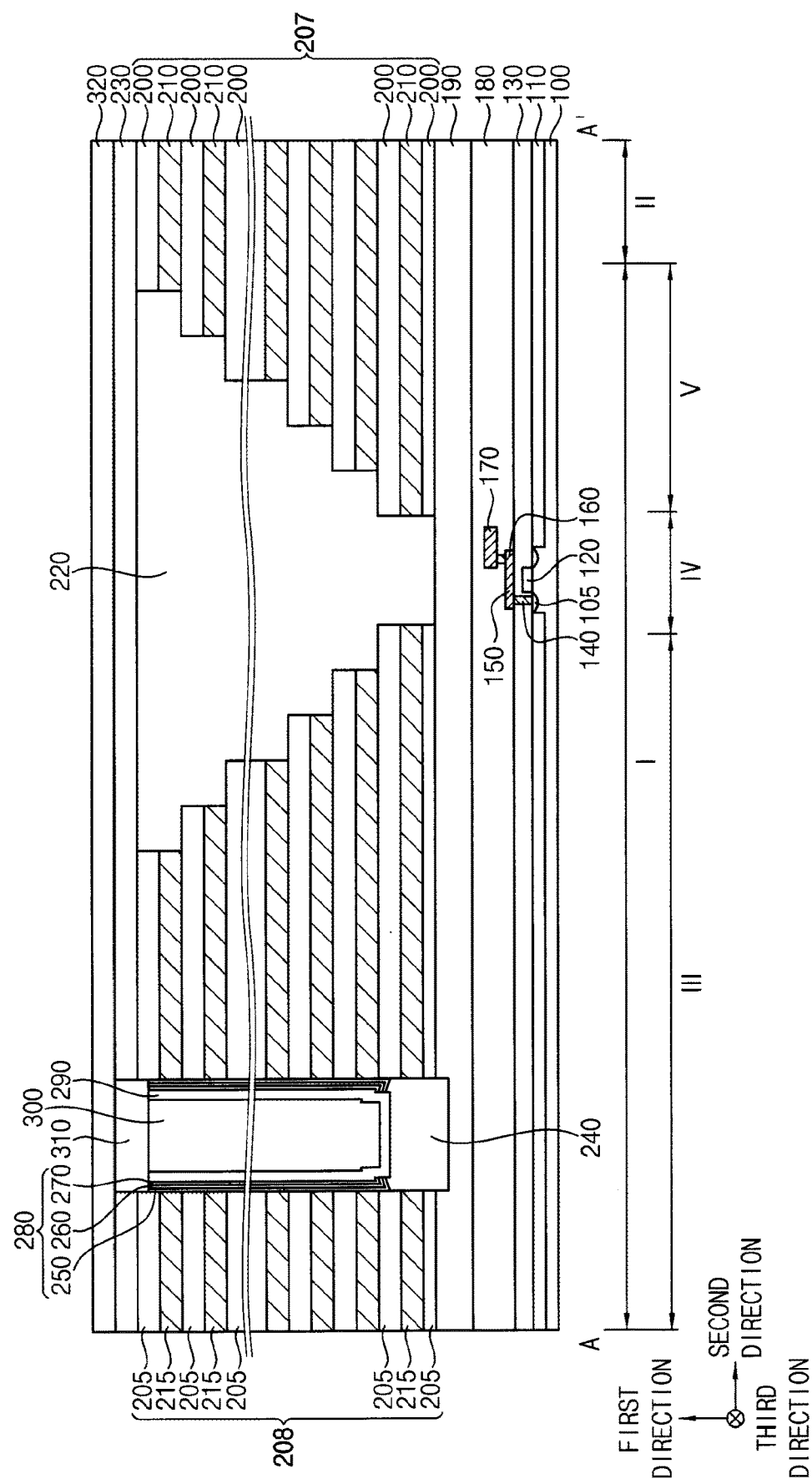
FIG. 13 illustrates a cross-sectional view along the line A-A' as shown in FIG. 12.

As illustrated in FIG. 13, a third insulating interlayer 320 may be formed on the second insulating interlayer 230 and the capping pattern 310, and a second mask may be formed on the third insulating interlayer 320. As illustrated in FIGS. 12 and 14, second openings 330 extending through the second and third insulating interlayers 230 and 320, the insulation layers 200, and the sacrificial layers 210, and extending in the second direction on the third region III of the substrate 100 may be formed using the second mask as an etching mask to expose the upper surface of the base pattern 190. Accordingly, the insulation layer 200 and the sacrificial layer 210 of the second mold 208 remaining on the third region III of the substrate 100 may be transformed into the insulation pattern 205 and the sacrificial pattern 215.

Ones of the second openings 330 formed on both edges in the third direction may be formed to be spaced apart from the fifth region V of the substrate 100 by a certain distance along the third direction. For example, the second openings 330 may not be formed on the middle portion of the third region III of the substrate 100 in the third direction.

Figure 15:
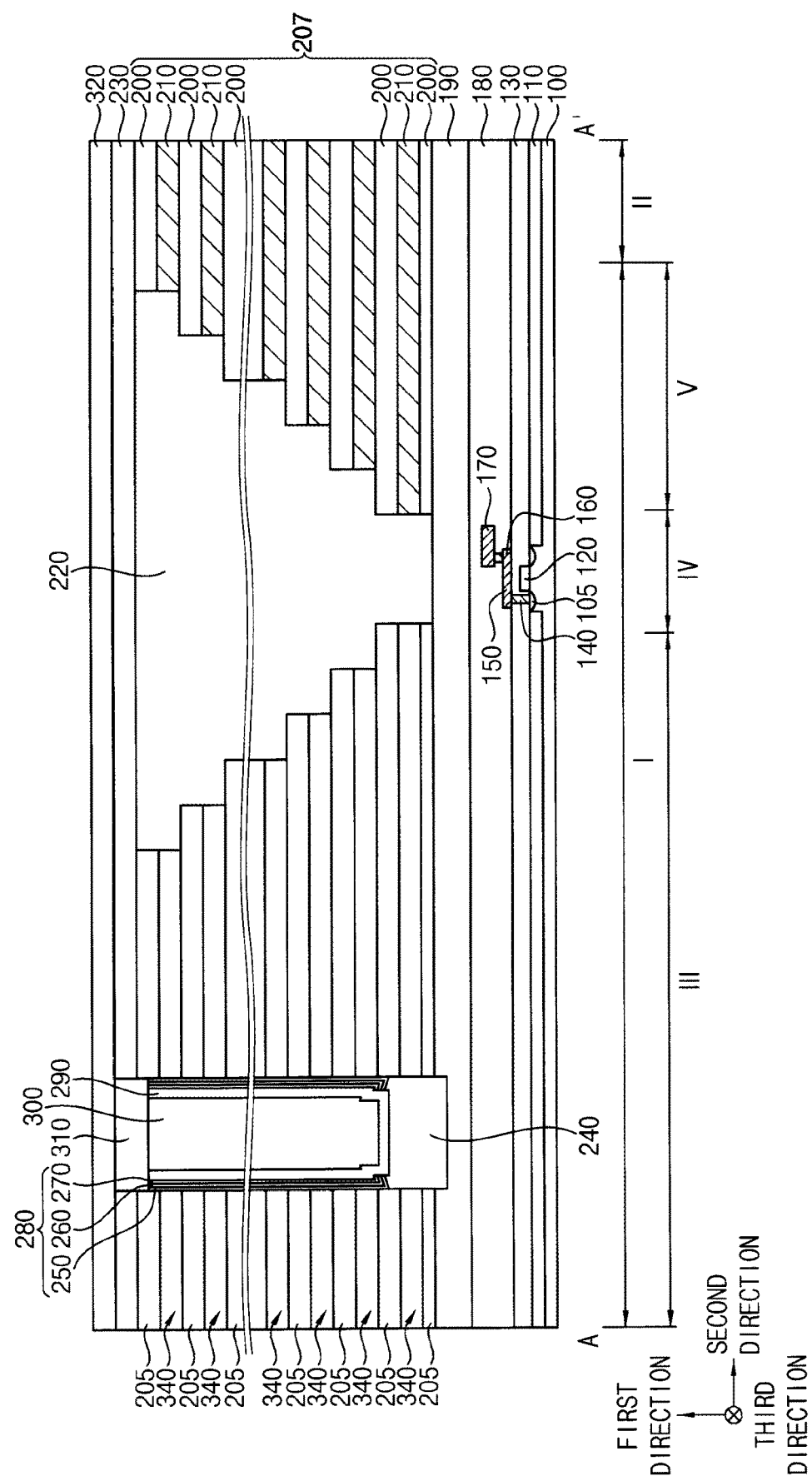
FIG. 15 illustrates a cross-sectional view along the line A-A' as shown in FIG. 1, after the removal of the second mask.

Referring to FIGS. 15 and 16, the second mask may be removed, the sacrificial patterns 215 exposed by the second openings 330 may be removed by, e.g., a wet etching process to form a gap 340 between the insulation patterns 205 of each level, and a portion of an outer sidewall of the first blocking pattern 250 and a sidewall of the semiconductor pattern 240 may be exposed by the gap 340. Since the second openings 330 are formed only on the third region III of the substrate 100, only the sacrificial patterns 215 of the second mold 208 remaining on the third region III of the substrate 100 may be removed by the wet etching process (FIG. 16), while the sacrificial layers 210 of the first mold 207 remaining on the second region II and the fifth region V of the substrate 100 may not be removed (FIG. 15).

In example embodiments, the first mold 207 may be formed on each of portions of the fifth region V disposed on both sides of the third region III of the substrate 100 in the third direction. In other example embodiments, the first mold 207 may be formed only on a portion of the fifth region V disposed on one side of the third region III of the substrate 100 in the third direction.

Since the second openings 330 may not be formed on the middle portion of the third region III of the substrate 100 in the third direction, the sacrificial patterns 215 may not be removed, but remain on the middle portion of the third region III of the substrate 100 to form the third mold 209 together with the insulation patterns 205. The third mold 209 may extend in the second direction on the third region III of the substrate 100.

In example embodiments, the first mold 207 may be a stair structure toward the fourth region IV of the substrate 100 having a staircase shape with one insulation layer 200 and one sacrificial layer 210 sequentially stacked together as each stair-step layer. Similar to the first mold 207, the third mold 209 may also be a staircase shape with one insulation pattern 205 and one sacrificial pattern 215 sequentially stacked together as each stair-step layer.

Referring to FIGS. 17 and 21, a second blocking layer 350 may be formed on the exposed outer sidewall of the first blocking pattern 250, the exposed sidewall of the semiconductor pattern 240, an inner sidewall of the gap 340, surfaces of the insulation patterns 205, the exposed upper surface of the base pattern 190, and an upper surface of the third insulating interlayer 320. A gate conductive layer may be formed on the second blocking layer 350 to sufficiently fill a remaining portion of the gap 340. A gate barrier layer may be further formed between the second blocking layer 350 and the gate conductive layer. The second blocking layer 350 may include a metal oxide, e.g., aluminum oxide, the gate conductive layer may include a low resistance metal, e.g., tungsten, aluminum, etc., and the gate barrier layer may include a metal nitride, e.g., titanium nitride, tantalum nitride, etc.

The gate conductive layer may be partially removed to form a gate conductive pattern in the gap 340, and when the gate barrier layer is formed, the gate barrier layer may also be removed to form a gate barrier pattern. The gate conductive pattern and the gate barrier pattern together may form a gate electrode. The gate electrode may be stacked on a plurality of levels to be spaced apart from each other along the first direction to form the gate electrode structure 360, and each of the gate electrodes may extend in the second direction on the third region III of the substrate 100.

In example embodiments, a plurality of gate electrode structures 360 may be formed along the third direction. That is, the gate electrode structures 360 may extend in the second direction, and may be spaced apart from each other in the third direction by the second opening 330. In one embodiment, one of the gate electrode structures 360 formed on each of both ends in the third direction may contact the first mold 207.

In example embodiments, the gate electrode structure 360 may contact the first mold 207 at a boundary between the third region III and the fifth region V of the substrate 100, and may contact the third mold 209 on the middle portion of the third region III of the substrate 100. In example embodiments, the gate electrodes of the gate electrode structure 360 may be formed at substantially the same height as the sacrificial layers 210 of the first mold 207 and the sacrificial patterns 215 of the third mold 209, respectively.

As the gate electrodes of the gate electrode structure 360 are formed by substituting the sacrificial patterns 215 on the third region III of the substrate 100, and the second mold 208 including the sacrificial patterns 215 has the staircase shape, the gate electrode structure 360 may also have a staircase shape with each gate electrode as each stair-step layer. In example embodiments, the stair-step layers of the gate electrode structure 360 may be formed at the same height as the sacrificial layers 210 included in the stair-step layers of the first mold 207 corresponding thereto, and the slope of the stair-step layers of the gate electrode structure 360 may be the same as the slope of the sacrificial layers 210 included in the stair-step layers of the first mold 207.

The gate electrode may include first to third gate electrodes 362, 364 and 366 sequentially formed along the first direction. In example embodiments, the first gate electrode 362 may be formed on a lowermost level, the third gate electrode 366 may be formed on an uppermost level and one level thereunder, i.e., first and second levels, and the second gate electrode 364 may be formed on a plurality of levels between the first gate electrode 362 and the third gate electrode 366, but embodiments are not limited thereto.

Impurities may be injected into an upper portion of the base pattern 190 exposed by the second opening 330 to from a second impurity region 195. A second spacer layer may be formed on the upper surface of the base pattern 190 exposed by the second opening 330, a sidewall of the second opening 330, and the upper surface of the third insulating interlayer 320, and the second spacer layer may be anisotropically etched to form a second spacer 370 on each of the sidewalls of the second opening 330. A common source pattern (CSP) 380 may be formed on the second impurity region 195 to fill a remaining portion of the second opening 330.

In example embodiments, a first conductive layer filling the second opening 330 may be formed on the exposed upper surface of the second impurity region 195, the second spacer 370 and the third insulating interlayer 320, and the first conductive layer may be planarized until the upper surface of the third insulating interlayer 320 may be exposed to form the CSP 380. A portion of the second blocking layer 350 formed on the upper surface of the third insulating interlayer 320 may also be removed. The CSP 380 may be formed in the second opening 330, and may contact the upper surface of the second impurity region 195 thereunder. By the CSP 380 and the second spacer 370 filling the second opening 330 that extends in the second direction, each of the first to third gate electrodes 362, 364 and 366 on the same level may be separated from each other along the third direction.

Referring to FIGS. 22 to 25, a fourth insulating interlayer 390 may be formed on the third insulating interlayer 320, the CSP 380, the second spacer 370, and the second blocking layer 350. A first contact plug 402 extending through the third and fourth insulating interlayers 320 and 390 and contacting an upper surface of the capping pattern 310 may be formed. Second to fourth contact plugs 404, 406 and 408 extending through the first to fourth insulating interlayers 220, 230, 320 and 390, the insulation patterns 205, and the second blocking layer 350, and contacting corresponding upper surfaces of the first to third gate electrodes 362, 364 and 366, may be formed.

A through via 410 may be formed to extend through the first to fourth insulating interlayers 220, 230, 320 and 390, the base pattern 190, and the second lower insulating interlayers 180, and contact an upper surface of the second lower wiring 170. After forming a fifth insulating interlayer on the fourth insulating interlayer 390, the first to fourth contact plugs 402, 404, 406 and 408 and the through via 410, a bit line extending through the fifth insulating interlayer and contacting an upper surface of the first contact plug 402, and upper wirings may be formed to complete the fabrication of the vertical memory device.

As described above, when patterning the mold layer that includes the insulation layers 200 and the sacrificial layers 210 alternately and repeatedly stacked on the substrate 100, portions of the mold layer formed on the second and fifth regions II and V of the substrate 100 may not be removed, i.e., may remain as the first mold 207. Accordingly, since the insulation layers 200 and the sacrificial layers 210 of the first mold 207 may include an oxide and a nitride, respectively, the compressive and tensile forces of each of the insulation layers 200 and the sacrificial layers 210 may be offset with each other, and the stress generated on the second region II of the substrate 100 may be decreased.

Figure 26:
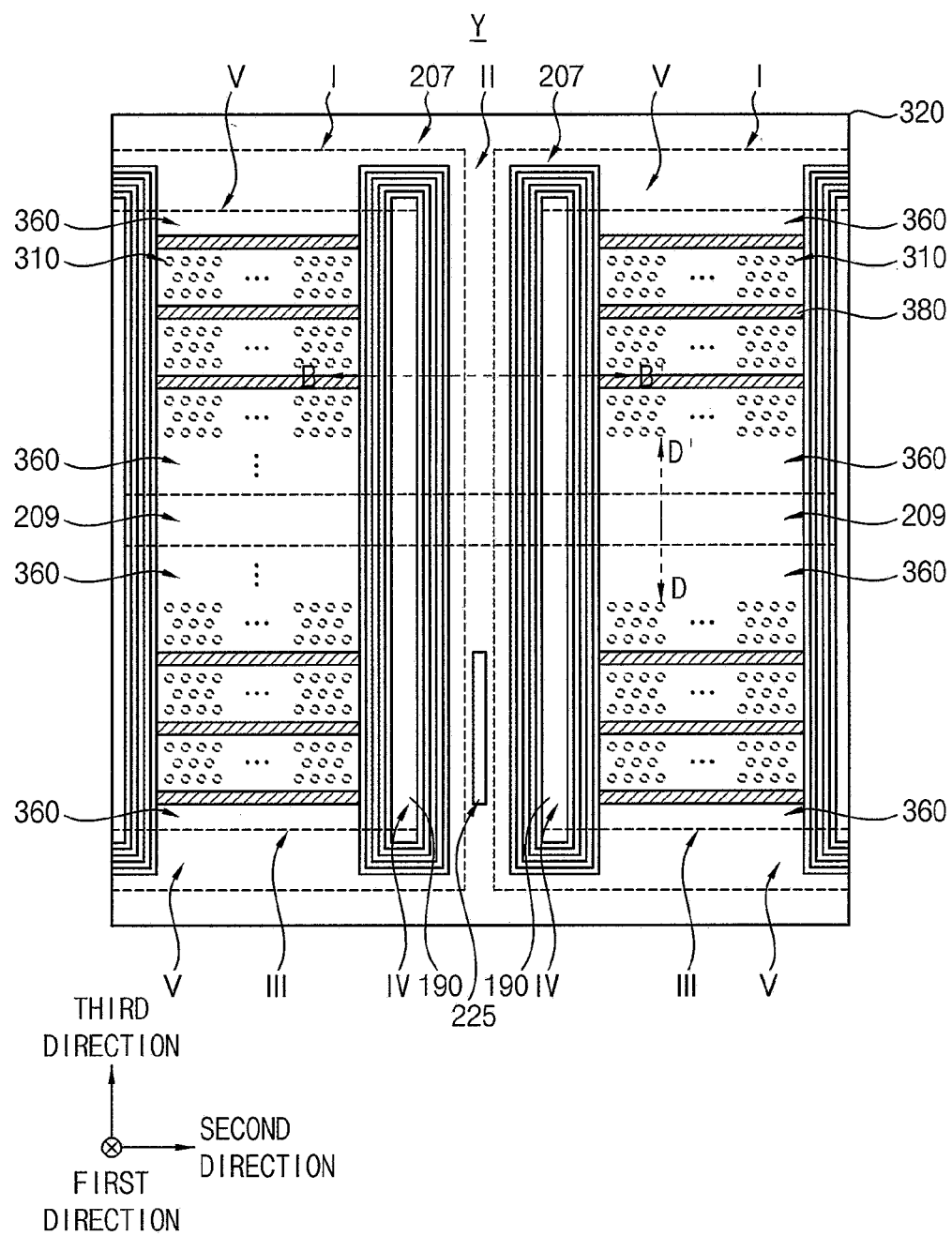
FIG. 26 illustrates a plan view of the vertical memory device after the formation of the alignment key.
Figure 27A:
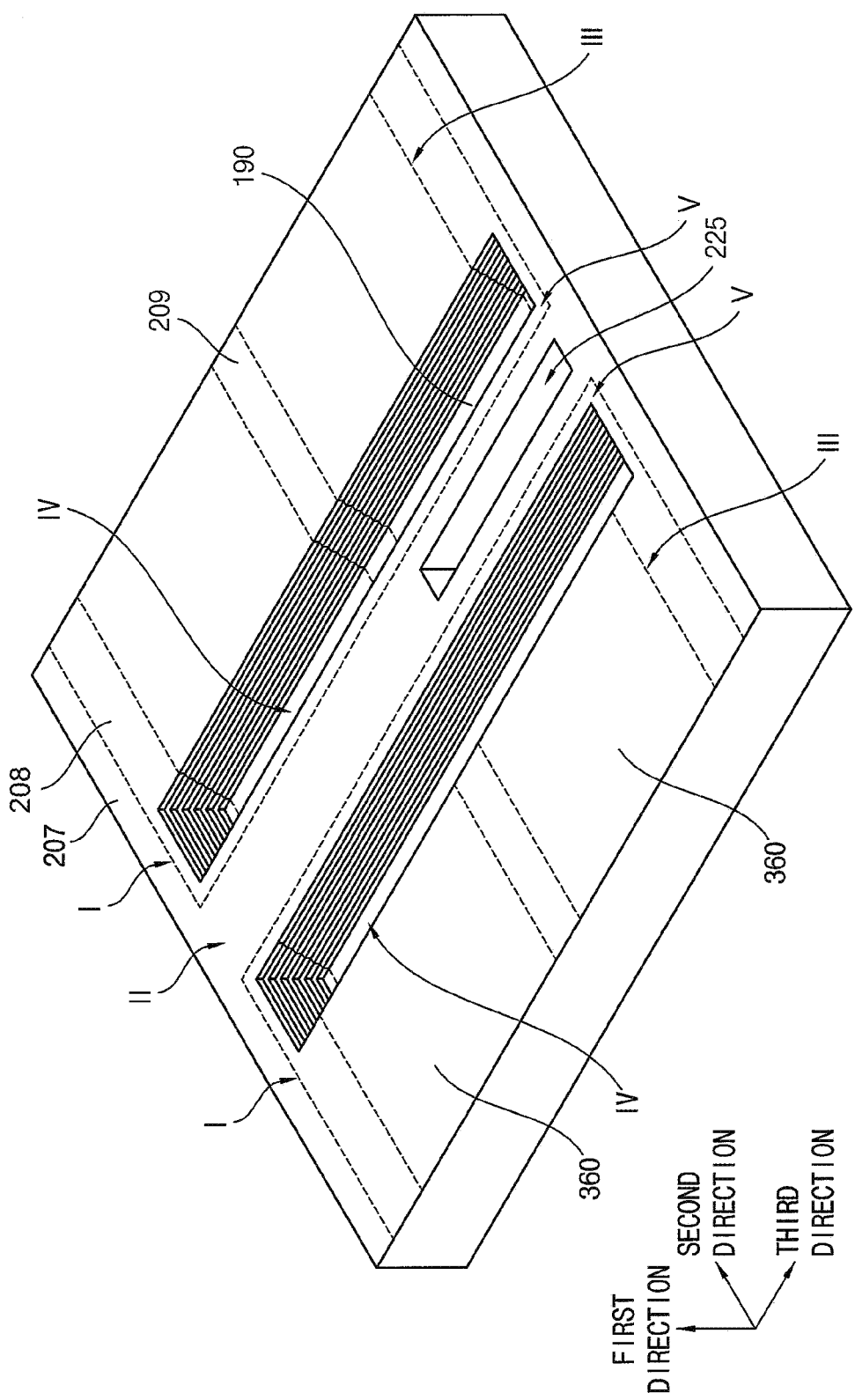
FIG. 27A illustrates a perspective view of the vertical memory device after the formation of the alignment key.
Figure 27B:
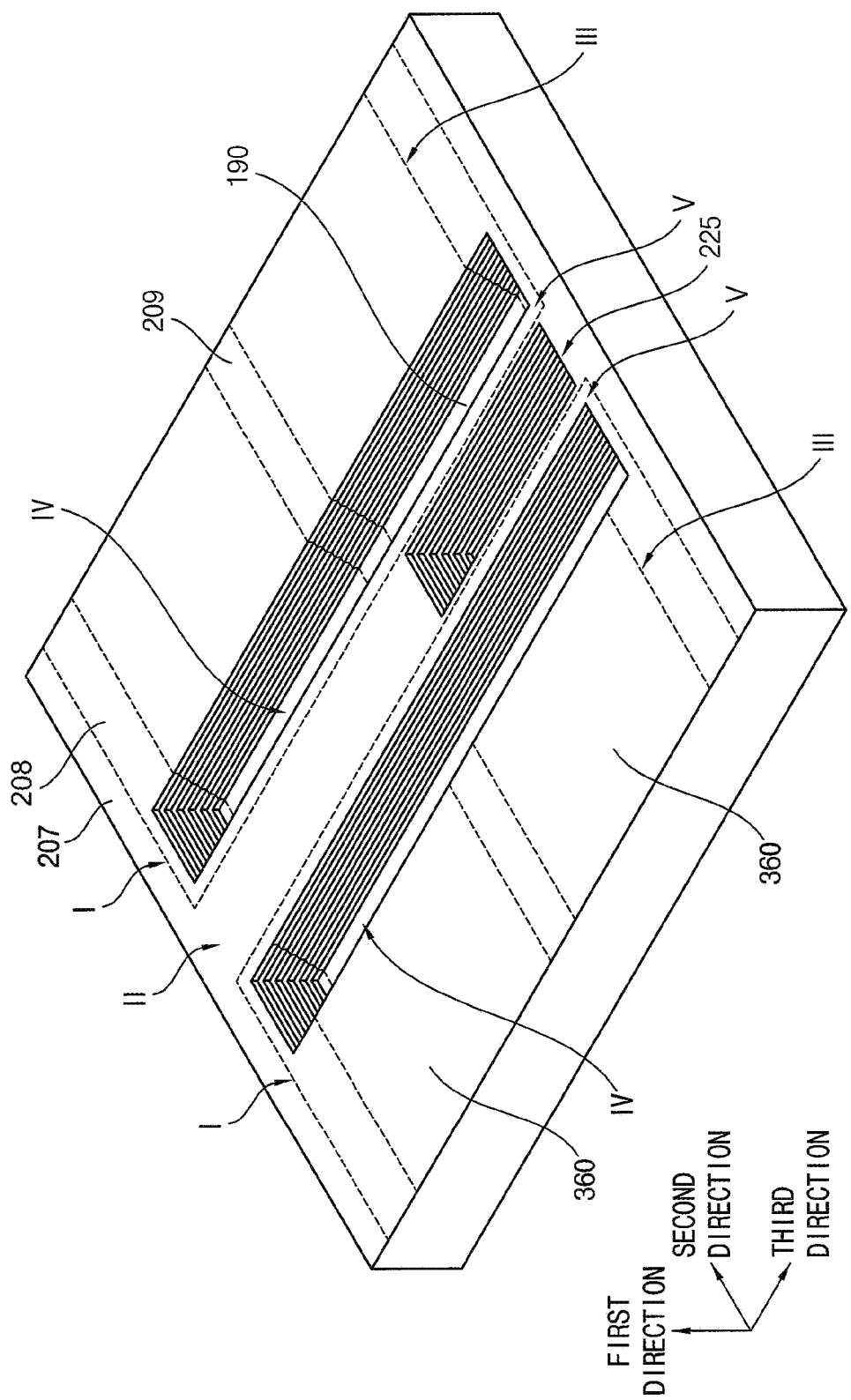
FIG. 27B illustrates a perspective view of the vertical memory device after the formation of the alignment key.

FIGS. 26, 27A and 27B are a plan view and perspective views illustrating a vertical memory device in accordance with example embodiments. Particularly, FIG. 26 is a plan view of the region Y of FIG. 1, and FIGS. 27A and 27B are perspective views of the region Y of FIG. 1.

The vertical memory device may be substantially the same as or similar to that of FIGS. 1 to 5, except for an alignment key. Thus, like reference numerals refer to like elements, and detailed descriptions thereof are omitted herein.

Referring to FIG. 26, before forming the second insulating interlayer 230, an alignment key 225 extending through the first mold 207 in the first direction may be further formed by partially removing the first mold 207 on the second region II of the substrate 100. In example embodiments, the alignment key 225 may be formed by removing the insulation layers 200 and the sacrificial layers 210 formed on all levels of the first mold 207, and the upper surface of the base pattern 190 may be exposed on a portion where the alignment key 225 is formed. Alternatively, the alignment key 225 may also be formed by removing the insulation layers 200 from the uppermost one to that of a certain level.

FIG. 26 illustrates that the alignment key 225 has a rectangular shape in the plan view, however, embodiments are not limited thereto. That is, the alignment key 225 may also have various shapes in addition to the rectangular shape in the plan view.

Also, FIG. 26 illustrates that one alignment key 225 is formed on the second region II of the substrate 100, however, embodiments are not limited thereto. That is, a plurality of alignment keys 225 may be formed on the second region II of the substrate 100, and may be formed on the first region I of the substrate 100.

Referring to FIG. 27A, an etching process using a third mask may be performed to partially remove the first mold 207 from the second region II. Thus, the alignment key 225 may have a sidewall substantially vertical to the upper surface of the substrate 100.

Referring to FIG. 27B, an etching process using a second photoresist pattern and a trimming process for reducing an area of the second photoresist pattern may be alternately and repeatedly performed to partially remove the first mold 207. Thus, the alignment key 225 may be formed to have a staircase shape with one insulation layer 200 and one sacrificial layer 210 sequentially stacked together as each stair-step layer.

Figure 28:
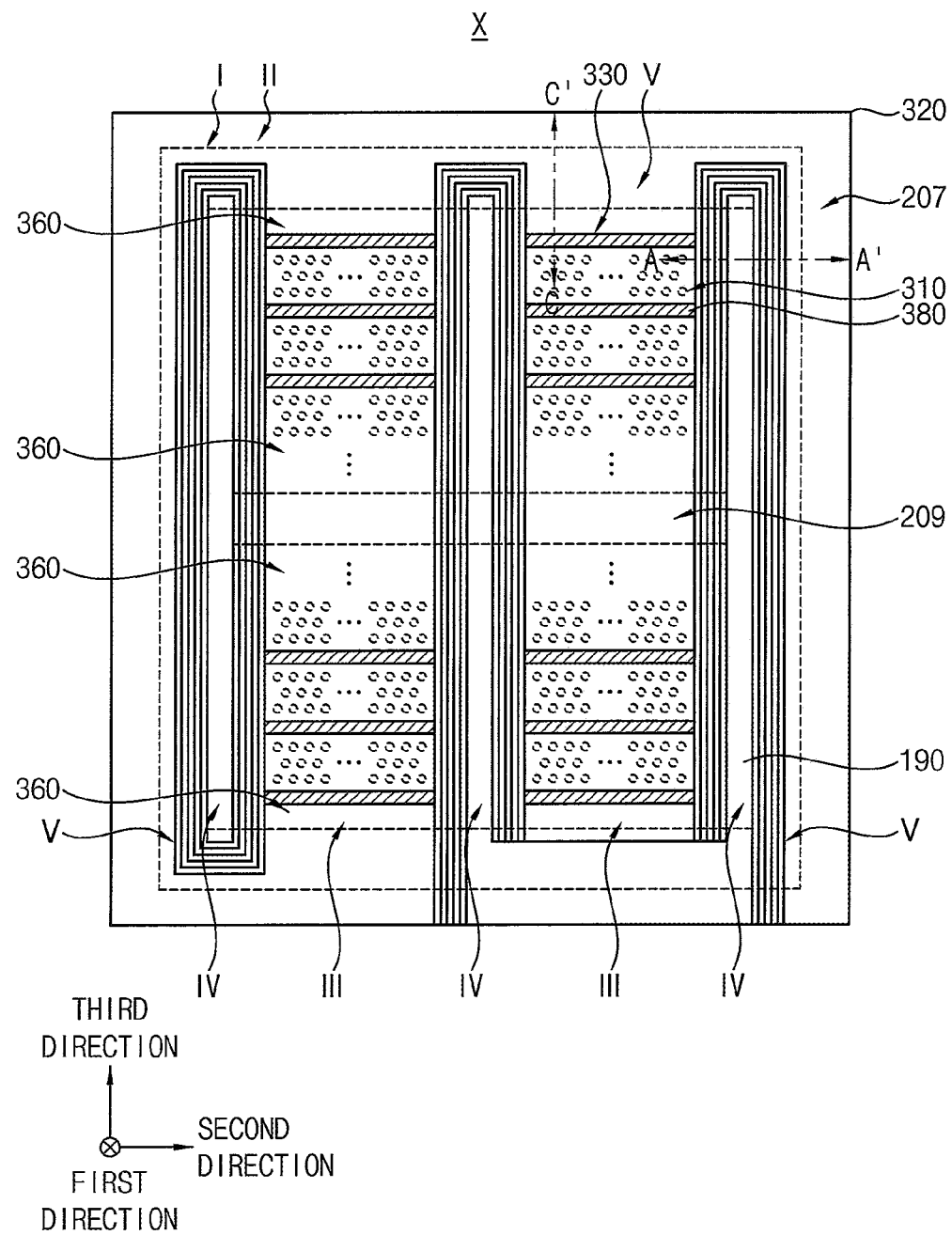
FIG. 28 illustrates a plan view of the vertical memory device after the formation of the first mold over portions of the vertical memory device.
Figure 29:
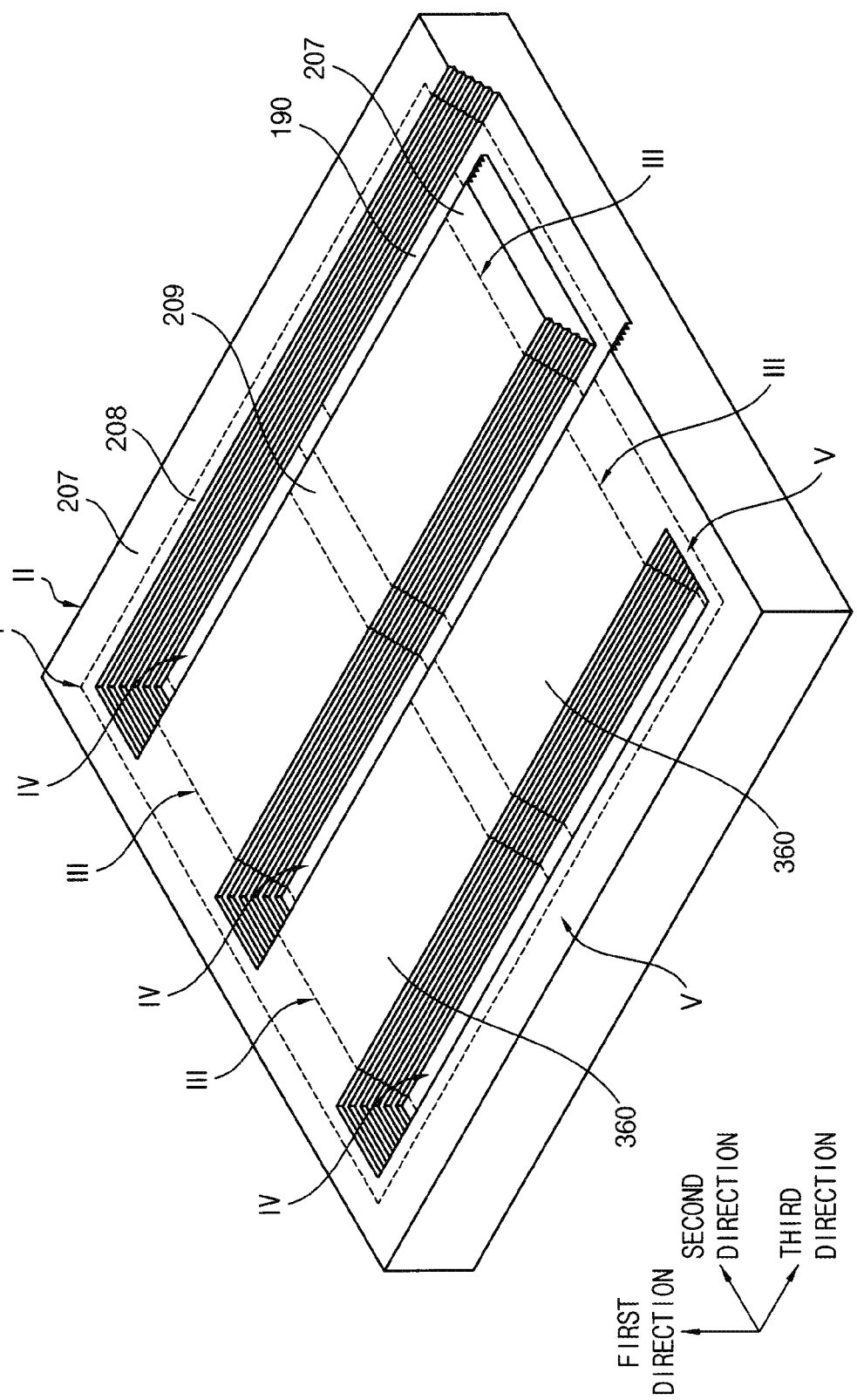
FIG. 29 illustrates a perspective view of the vertical memory device after the formation of the first mold over portions of the vertical memory device.
Figure 30:
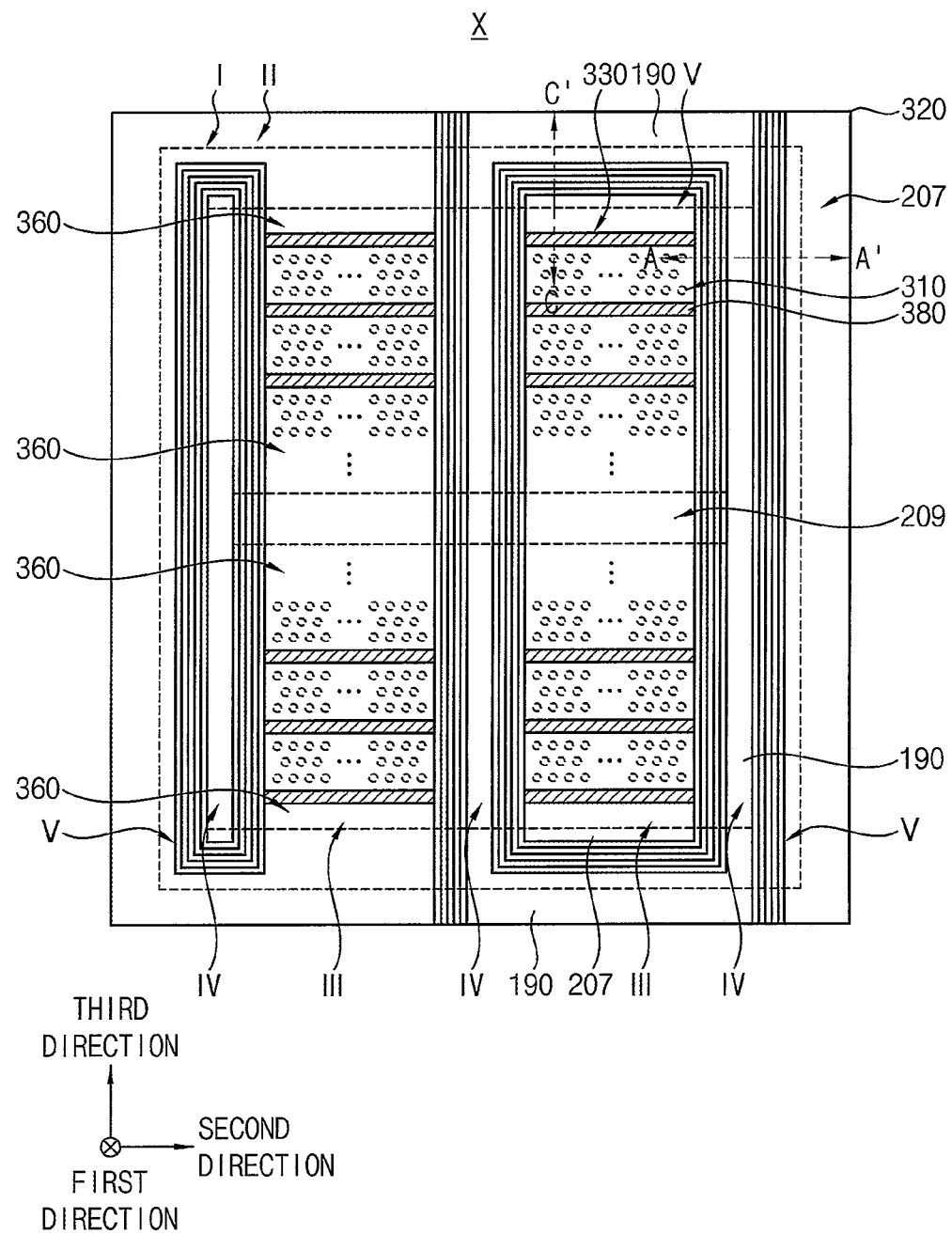
FIG. 30 illustrates a plan view of the vertical memory device after the formation of the first mold.
Figure 31:
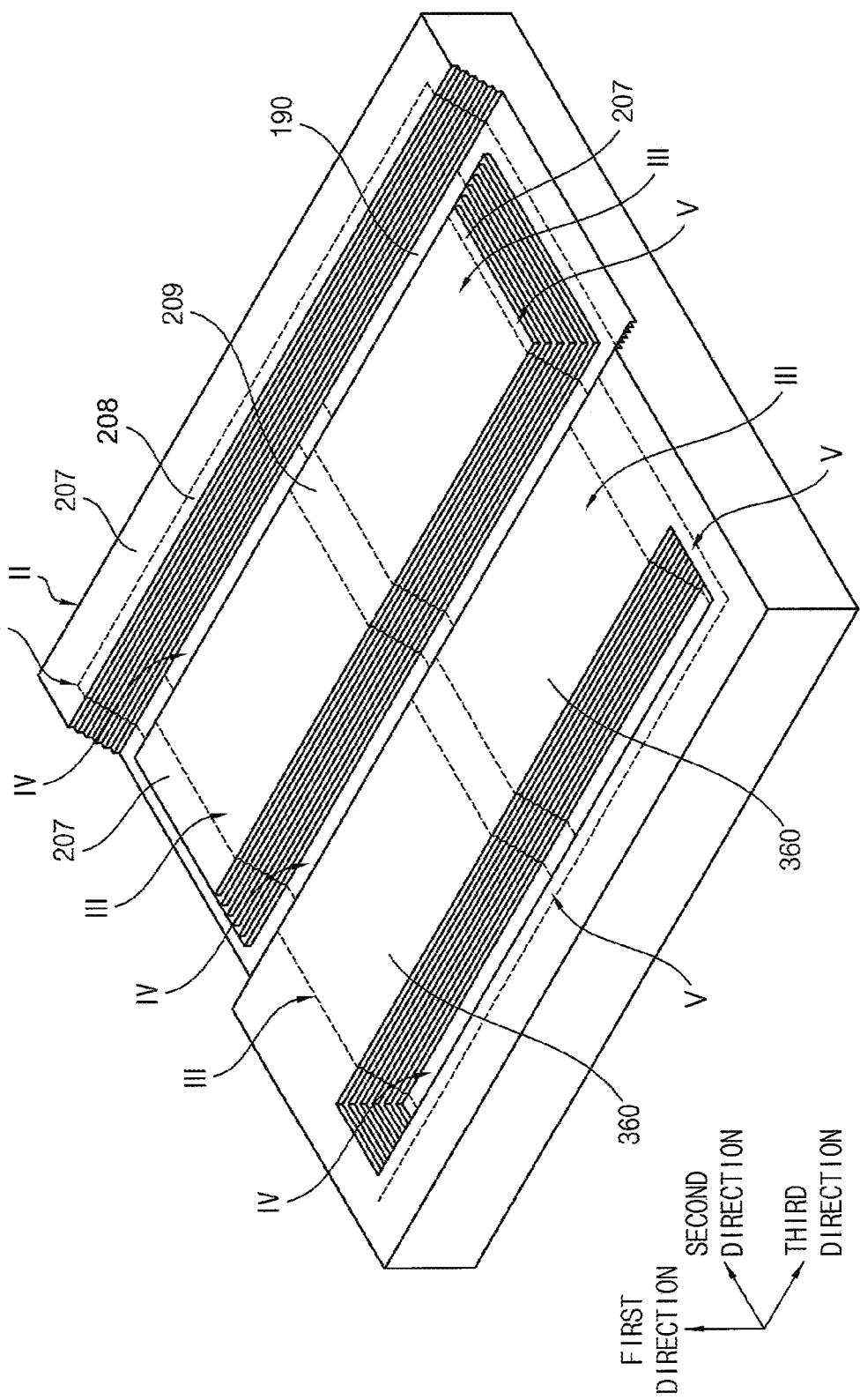
FIG. 31 illustrates a perspective view of the vertical memory device after the formation of the first mold.
Figure 32:
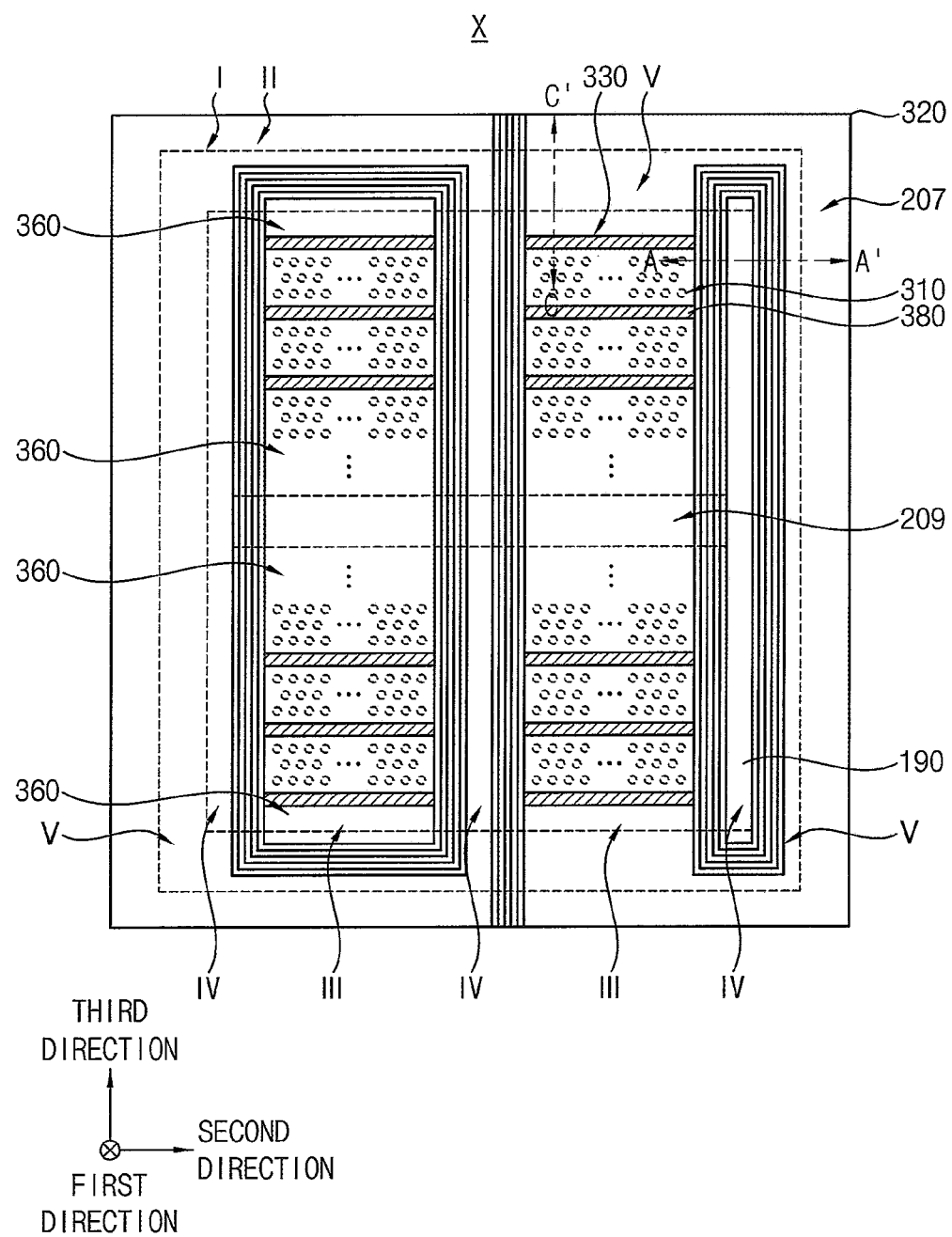
FIG. 32 illustrates a plan view of the vertical memory device in accordance with example embodiments.

FIGS. 28 to 33 are plan views and perspective views illustrating vertical memory devices in accordance with example embodiments. Particularly, FIGS. 28, 30 and 32 are plan views of the region X of FIG. 1, and FIGS. 29, 31 and 33 are perspective views of the region X of FIG. 1.

The vertical memory device may be substantially the same as or similar to that of FIGS. 1 to 5, except for the shape of the first mold. Thus, like reference numerals refer to like elements, and detailed descriptions thereof are omitted herein.

Referring to FIGS. 28 and 29, the first mold 207 may be formed on portions of the fifth region V disposed on each of both sides in the third direction of a first cell region that is formed at the left side among the third regions III of the substrate 100, and may be formed on a portion of the fifth region V disposed on one side in the third direction of a second cell region that is formed at the right side among the third regions III of the substrate 100. Accordingly, the first mold 207 may completely surround both sides in the third direction of the first cell region, but may partially surround only one side in the third direction of the second cell region.

The first mold 207 may be formed by performing an etching process using a fourth mask, after performing processes substantially the same as or similar to those of FIGS. 6 to 9, and the etching process using the fourth mask may be performed to remove a portion of the first mold 207 on one side of the second cell region. The portions of the first mold 207 removed from the second and fifth regions II and V of the substrate 100 may serve as an alignment key.

Referring to FIGS. 30 and 31, the first mold 207 may be formed on portions of the fifth region V disposed on each of both sides in the third direction of the first cell region, and may not be formed on portions of the fifth region V disposed on each of both sides in the third direction of the second cell region. Accordingly, the first mold 207 may completely surround both sides in the third direction of the first cell region, but may not surround both sides in the third direction of the second cell region.

The first mold 207 may be formed by performing a trimming process using a third photoresist pattern and an etching process, after performing processes substantially the same as or similar to those of FIGS. 6 to 9, and the trimming process using the third photoresist pattern and the etching process may be performed to remove portions of the first mold 207 from both sides of the second cell region.

In example embodiments, the remaining portion of the first mold 207 on each of both sides of the second cell region may have a staircase shape with one insulation layer 200 and one sacrificial layer 210 sequentially stacked together as each stair-step layer.

In example embodiments, the sacrificial layers 210 included in the stair-step layers of the remaining portion of the first mold 207 on each of both sides of the second cell region may be formed at the same height as the stair-step layers of the gate electrode structure 360 corresponding thereto and the sacrificial layers 210 included in the stair-step layers of the first mold 207, and may have a slope substantially the same as the slope of the stair-step layers of the gate electrode structure 360 and the slope of the sacrificial layers 210 included in the stair-step layers of the first mold 207. The portions of the first mold 207 removed on the second and fifth regions II and V of the substrate 100 may serve as an alignment key.

Figure 33:
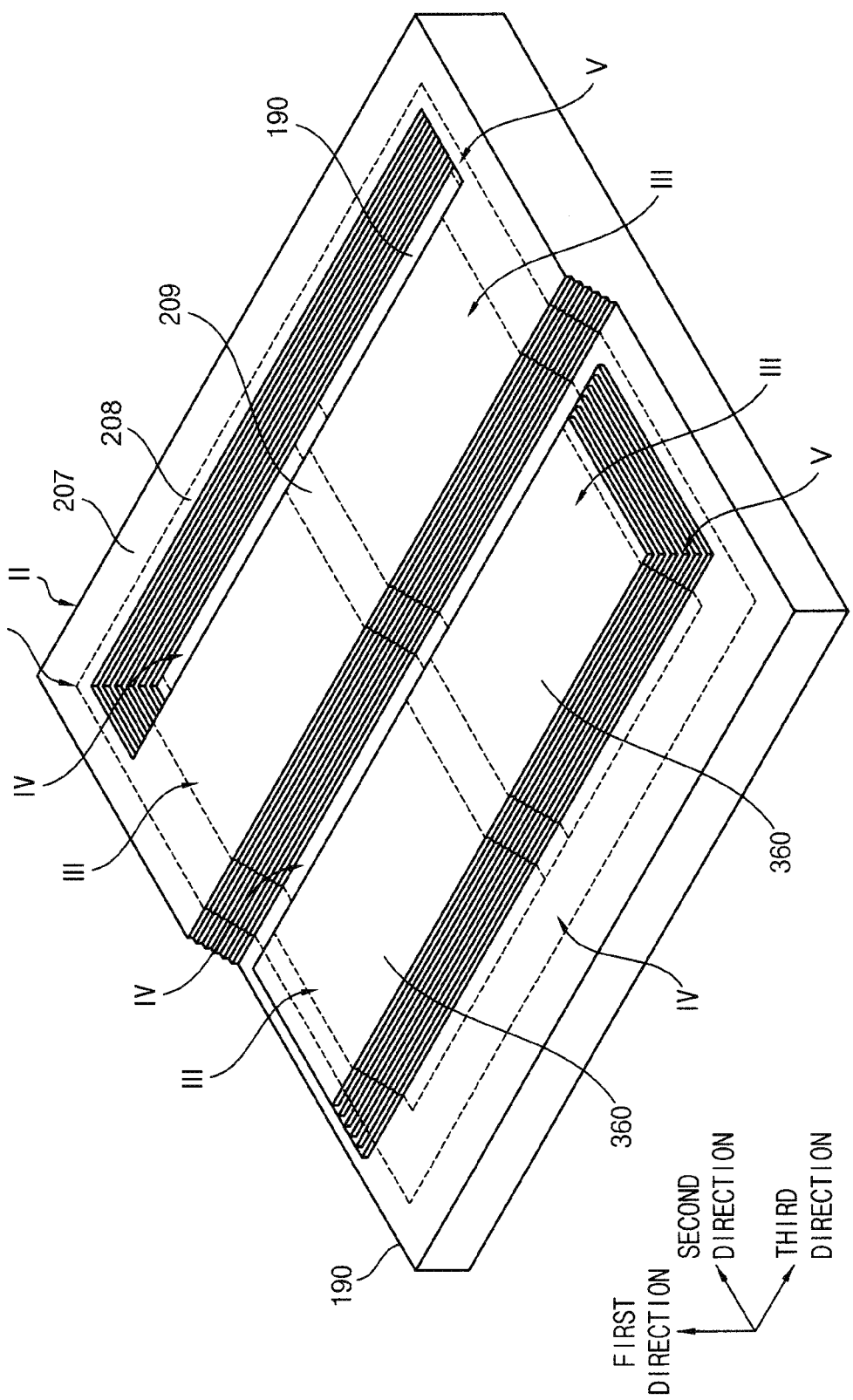
FIG. 33 illustrates a perspective view of the vertical memory device in accordance with example embodiments.

Referring to FIGS. 32 and 33, the first mold 207 may not be formed on portions of the fifth region V disposed on each of all sides in the second and third directions of the first cell region, and may be formed only on portions of the fifth region V disposed on all sides of the second cell region except for one side thereof opposite to the first cell region. Accordingly, the first mold 207 may not surround all sides the first cell region, and may surround all sides of the second cell region except for one side. The first mold 207 may be formed by performing a trimming process using a fourth photoresist pattern and an etching process after performing processes substantially the same as or similar to those of FIGS. 6 to 9, and the trimming process using the fourth photoresist pattern and the etching process may be performed only on the first cell region.

Figure 34:
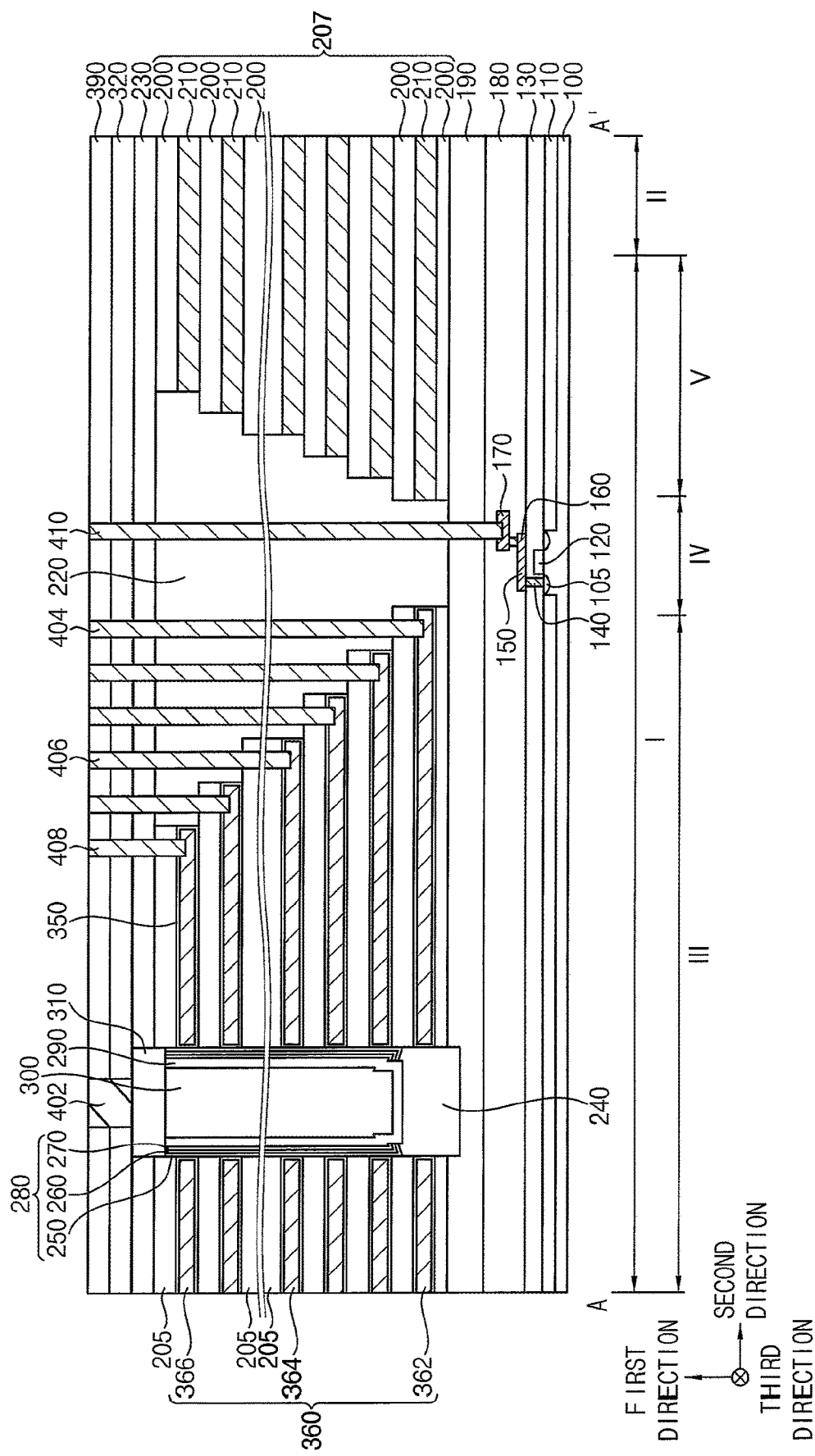
FIGS. 34 and 35 illustrate cross-sectional views of the vertical memory device in accordance with example embodiments.
Figure 35:
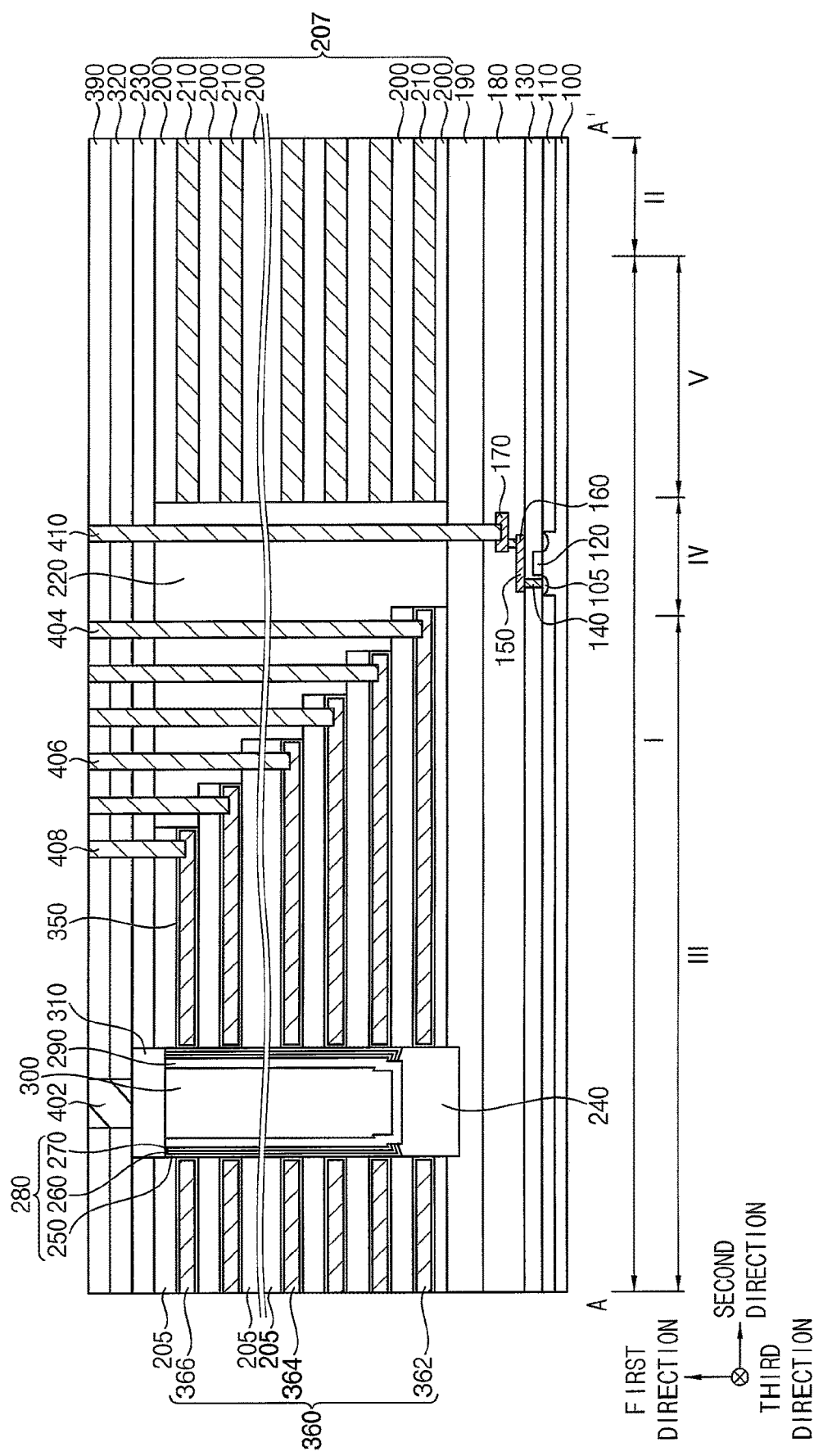

FIGS. 34 and 35 are cross-sectional views illustrating vertical memory devices in accordance with example embodiments. FIGS. 34 and 35 are cross-sectional views taken along lines A-A' of corresponding plan views.

The vertical memory device may be substantially the same as or similar to that of FIGS. 1 to 5, except for the shape of the portion of the first mold on the fifth region of the substrate. Thus, like reference numerals refer to like elements, and detailed descriptions thereof are omitted herein.

Referring to FIG. 34, among portions of the stair structure surrounding the fourth region IV of the substrate 100, a portion on the fifth region V of the substrate 100 may have a slope steeper than that of a portion on the third region III of the substrate 100.

Referring to FIG. 35, among portions of the stair structure surrounding the fourth region IV of the substrate 100, the portion on the fifth region V of the substrate 100 may not have the staircase shape.

In example embodiments, the portion of the first mold 207 extending along the third direction and being formed on the fifth region V of the substrate 100 adjacent to the fourth region IV may have a sidewall substantially vertical to the upper surface of the substrate 100.

By way of summation and review, when the insulating interlayer is made of a single material of an oxide having a compressive force or a nitride having a tensile force, a stress generated on the S/L region may be increased. Accordingly, differences of stress may occur between the S/L region and the chip region, and a test using a test element group (TEG) that is formed on the S/L region may have a limited accuracy.

In contrast, example embodiments provide vertical memory devices having improved characteristics. Example embodiments provide methods of manufacturing vertical memory devices having improved characteristics. That is, in a method of manufacturing a vertical memory device according to example embodiments, when an etching process is performed to pattern a mold layer including insulation layers and sacrificial layers alternately and repeatedly stacked on a substrate that includes a chip region and a S/L region, a portion of the mold layer formed on the S/L region may not be removed. Accordingly, since, as in the chip region, the mold layer including the insulation layers and the sacrificial layers having a compressive force and a tensile force, respectively, may remain on the S/L region, a stress generated on the S/L region may be decreased, and since the S/L region has a stress similar to that of the chip region, a test using a test element group (TEG) that is formed on the S/L region may be accurately performed.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a vertical memory device, the method comprising:
   alternately and repeatedly stacking insulation layers and sacrificial layers along a first direction to form a mold layer on a substrate, the first direction being substantially vertical to an upper surface of the substrate, and the substrate including:
   a cell region,
   a through via region formed on each of two opposite sides of the cell region,
   a mold region surrounding the cell region and the through via region, and
   a scribe lane (S/L) region surrounding the mold region;
   removing a portion of the mold layer formed on the through via region, the cell region and the mold region to form a first mold and a second mold, wherein the first mold is formed on both the mold region and the S/L region and the second mold is formed on the cell region;
   forming a channel extending through the second mold;
   forming an opening extending through the second mold; and
   replacing each of the sacrificial layers in the second mold with gate electrodes through the opening.

2. The method as claimed in claim 1, wherein the sacrificial layers included in the first mold remain without being replaced with the gate electrodes.

3. The method as claimed in claim 1, wherein:
   the through via region is formed on each of two opposite sides of the cell region in a second direction substantially parallel to the upper surface of the substrate, and
   a plurality of openings are formed along a third direction substantially parallel to the upper surface of the substrate and intersecting the second direction, each of the openings extending in the second direction and through the second mold.

4. The method as claimed in claim 3, wherein the sacrificial layers in the first mold contact the gate electrodes formed in at least portions of the second mold in the third direction.

5. The method as claimed in claim 3, wherein:
   the second mold has a staircase shape facing the second direction, and
   a portion of the first mold opposite the second mold has a staircase shape corresponding to the staircase shape of the second mold.

6. The method as claimed in claim 3, wherein portions of the first and second molds surrounding the through via region have staircase shapes, and are connected to each other.

7. The method as claimed in claim 3, wherein the sacrificial layers in the second mold on a central portion of the cell region in the third direction are not replaced with the gate electrodes.

8. The method as claimed in claim 1, wherein removing the portion of the mold layer to form the first and second molds includes partially etching the first mold to form an alignment key.

9. A method of manufacturing a vertical memory device, the method comprising:
   alternately and repeatedly stacking an insulation layer and a sacrificial layer along a first direction to form a mold layer on a substrate along a first direction substantially vertical to an upper surface of the substrate;

forming a first opening that extends through the mold layer to partially remove the mold layer, portions of the mold layer surrounding the first opening on opposite sides of the first opening having staircase shapes;

forming a channel to extend through the mold layer;

forming a second opening to extend through the mold layer; and replacing sacrificial layers in the mold layer with gate electrodes, through the second opening, wherein when replacing the sacrificial layers with the gate electrodes, one or more sacrificial layers in an edge portion of the mold layer are not replaced.

10. The method as claimed in claim 9, wherein:

a plurality of first openings are formed along a second direction substantially parallel to the upper surface of the substrate, and a portion of the mold layer between two adjacent first openings of the plurality of first openings has a staircase shape toward the second direction.

11. The method as claimed in claim 10, wherein:

a plurality of second openings is are formed along a third direction substantially parallel to the upper surface of the substrate and intersecting the second direction, wherein each of the plurality of second openings extends in the second direction, and end portions of each of the plurality of second openings are connected to the plurality of first openings, and a portion of the mold layer between the plurality of first openings neighboring each other in the second direction is separated into a plurality of molds spaced apart from each other by the plurality of second openings along the third direction.

12. The method as claimed in claim 11, wherein the sacrificial layers included in an end portion of the mold layer contact the gate electrodes formed in at least one of the molds.

13. The method as claimed in claim 11, wherein a plurality of channels are formed along each of the second and third directions in each of the plurality of molds.

14. The method as claimed in claim 11, wherein the sacrificial layers in the mold layer on a central portion of a cell region in the third direction are not replaced with the gate electrodes.

15. A method of manufacturing a vertical memory device, the method comprising:

alternately and repeatedly stacking an insulation layer and a sacrificial layer along a first direction to form a mold layer on a substrate along a first direction substantially vertical to an upper surface of the substrate;

partially removing the mold layer to form a plurality of first openings along a second direction substantially parallel to the upper surface of the substrate, each of the plurality of first openings extending through the mold layer and extending in a third direction substantially parallel to the upper surface of the substrate and intersecting the second direction, a portion of the mold layer surrounding each of the plurality of first openings having a staircase shape;

forming a channel to extend through the mold layer between two adjacent first openings of the plurality of first openings and to extend in the first direction;

forming a plurality of second openings to extend through the mold layer and extend in the second direction, and forming a plurality of molds to be spaced apart from each other along the third direction; and replacing the sacrificial layers in the plurality of molds with gate electrodes through the plurality of second openings, wherein the sacrificial layers included in an edge portion of the mold layer do not contact the gate electrodes.

16. The method as claimed in claim 15, wherein the sacrificial layers in the mold layer on a central portion of a cell region in the third direction are not replaced with the gate electrodes.

17. The method as claimed in claim 15, wherein for each opening of the plurality of second openings, the sacrificial layers included in portions of the mold layer formed on opposite sides of the second opening in the third direction are partially replaced with the gate electrodes.

* * * * *